(12) United States Patent
Park

(10) Patent No.: US 8,362,500 B2
(45) Date of Patent: Jan. 29, 2013

(54) LIGHT EMITTING DEVICE, METHOD OF MANUFACTURING THE LIGHT EMITTING DEVICE, LIGHT EMITTING DEVICE PACKAGE, AND LIGHTING SYSTEM

(75) Inventor: Kyung Wook Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 18 days.

(21) Appl. No.: 13/031,775

(22) Filed: Feb. 22, 2011

(65) Prior Publication Data

US 2011/0241037 A1    Oct. 6, 2011

(30) Foreign Application Priority Data

Apr. 1, 2010 (KR) .................. 10-2010-0030015

(51) Int. Cl.
*H01L 33/00* (2010.01)
(52) U.S. Cl. .................. 257/89; 257/91; 257/E33.062
(58) Field of Classification Search .................. 257/89, 257/91, 98, 99, E33.062
See application file for complete search history.

(56) References Cited

U.S. PATENT DOCUMENTS

| | | | |
|---|---|---|---|
| 2002/0180345 A1 | 12/2002 | Hen | 313/499 |
| 2005/0189551 A1 | 9/2005 | Peng et al. | 257/94 |
| 2006/0267026 A1 | 11/2006 | Kim et al. | 257/79 |
| 2008/0116470 A1 | 5/2008 | Nishimura | 257/89 |
| 2008/0251799 A1 | 10/2008 | Ikezawa | 257/89 |
| 2009/0109151 A1* | 4/2009 | Kim et al. | 345/83 |
| 2009/0146165 A1 | 6/2009 | Hasnain et al. | 257/98 |
| 2009/0173964 A1* | 7/2009 | Ward et al. | 257/103 |
| 2009/0309120 A1 | 12/2009 | Heidborn et al. | 257/99 |

FOREIGN PATENT DOCUMENTS

| | | |
|---|---|---|
| KR | 10-2003-0066955 A | 8/2003 |
| KR | 10-2007-0036375 A | 4/2007 |
| KR | 10-2007-0113768 A | 11/2007 |
| KR | 10-2008-0102538 A | 11/2008 |

OTHER PUBLICATIONS

European Search Report dated Sep. 15, 2011 issued in Application No. 11 15 7953.

* cited by examiner

*Primary Examiner* — Benjamin Sandvik
*Assistant Examiner* — Whitney T Moore
(74) *Attorney, Agent, or Firm* — KED & Associates LLP

(57) ABSTRACT

Provided are a light emitting device and a light emitting device package having the same. The light emitting device includes a first light emitting structure layer including a plurality of semiconductor layers, a first electrode on the first light emitting structure layer, a first insulation layer under the first light emitting structure layer, a second light emitting structure layer including a plurality of semiconductor layers under a first reflective layer, a second reflective layer under the second light emitting structure layer, a bonding layer between the second light emitting structure layer and the first reflective layer, and a plurality of connection members connecting the first light emitting structure layer to the second light emitting structure layer in parallel.

16 Claims, 20 Drawing Sheets

LIGHT EMITTING DEVICE, METHOD OF MANUFACTURING THE LIGHT EMITTING DEVICE, LIGHT EMITTING DEVICE PACKAGE, AND LIGHTING SYSTEM

CROSS-REFERENCE TO RELATED APPLICATIONS

The present application claims priority under 35 U.S.C. §119(a) of Korean Patent Application No. 10-2010-0030015 filed on Apr. 1, 2010, which is hereby incorporated by reference in its entirety.

BACKGROUND

Embodiments relate to a light emitting device, a light emitting device package, and a lighting system.

Due to their physical and chemical characteristics, Group III-V nitride semiconductors are being esteemed as core materials for light-emitting devices such as light-emitting diodes (LEDs) and laser diodes (LDs). Each of the Group III-V nitride semiconductors is formed of a semiconductor material having a compositional formula of $In_xAl_yGa_{1-x-y}N$ ($0 \leq x \leq 1$, $0 \leq y \leq 1$, $0 \leq x+y \leq 1$).

LEDs are a kind of semiconductor device that is used as a light source or uses the characteristics of compound semiconductors to convert electricity into infrared rays or light, thereby receiving or transmitting signals therebetween.

These semiconductor based LEDs or LDs are widely used in light-emitting devices, and are applied as light sources for various products such as keypad light-emitting units of mobile phones, electric light panels, and illumination devices.

SUMMARY

Embodiments provide a light emitting device having a new structure.

Embodiments also provide a light emitting device in which a plurality of chip structures is jointed to each other.

Embodiments also provide a light emitting device in which a plurality of chip structures is vertically laminated to each other.

Embodiments may improve reliability of a light emitting device package including a light emitting device and a lighting system.

In one embodiment, a light emitting device includes: a first light emitting structure layer including a first conductive type semiconductor layer, a second conductive type semiconductor layer, and a first active layer between the first conductive type semiconductor layer and the second conductive type semiconductor layer; a first electrode connected to the first conductive type semiconductor layer; a first reflective layer under the first light emitting structure layer; a second light emitting structure layer including a third conductive type semiconductor layer, a fourth conductive type semiconductor layer, and a second active layer between the third conductive type semiconductor layer and the fourth conductive type semiconductor layer; a second reflective layer under the second light emitting structure layer; a bonding layer between the second light emitting structure layer and the first reflective layer; a first connection member connecting the first conductive type semiconductor layer of the first light emitting structure layer to the third conductive type semiconductor layer of the second light emitting structure layer; and a second connection member connecting the second conductive type semiconductor layer of the first light emitting structure layer to the fourth conductive type semiconductor layer of the second light emitting structure layer.

In another embodiment, a light emitting device includes: a first light emitting structure layer including a first conductive type semiconductor layer, a first active layer, and a second conductive type semiconductor layer; a first electrode on the first light emitting structure layer; a first insulation layer under the first light emitting structure layer; a second light emitting structure layer including a third conductive type semiconductor layer, a second active layer, and a fourth conductive type semiconductor layer; a conductive support member under the second light emitting structure layer; a plurality of bonding layers disposed between the first insulation layer and the second light emitting structure layer and jointed to each other; a second insulation layer between the bonding layer and the second light emitting structure layer; and a connection member connecting at least one layer of the first light emitting structure layer to at least one layer of the second light emitting structure layer.

In further embodiment, a body; a plurality of lead electrodes on the body; a light emitting device bonded on at least one lead electrode of the plurality of lead electrodes, the light emitting device being electrically connected to the plurality of lead electrodes; and a molding member molding the light emitting device, wherein the light emitting device includes: a first light emitting structure layer including a first conductive type semiconductor layer, a second conductive type semiconductor layer, and a first active layer between the first conductive type semiconductor layer and the second conductive type semiconductor layer; a first electrode connected to the first conductive type semiconductor layer; a first reflective layer under the first light emitting structure layer; a second light emitting structure layer including a third conductive type semiconductor layer, a fourth conductive type semiconductor layer, and a second active layer between the third conductive type semiconductor layer and the fourth conductive type semiconductor layer; a second reflective layer under the second light emitting structure layer; a bonding layer between the second light emitting structure layer and the first reflective layer; a first connection member connecting the first conductive type semiconductor layer of the first light emitting structure layer to the third conductive type semiconductor layer the second light emitting structure layer; and a second connection member connecting the second conductive type semiconductor layer of the first light emitting structure layer to the fourth conductive type semiconductor layer of the second light emitting structure layer.

The details of one or more embodiments are set forth in the accompanying drawings and the description under. Other features will be apparent from the description and drawings, and from the claims.

DETAILED DESCRIPTION OF THE EMBODIMENTS

Figure 1:
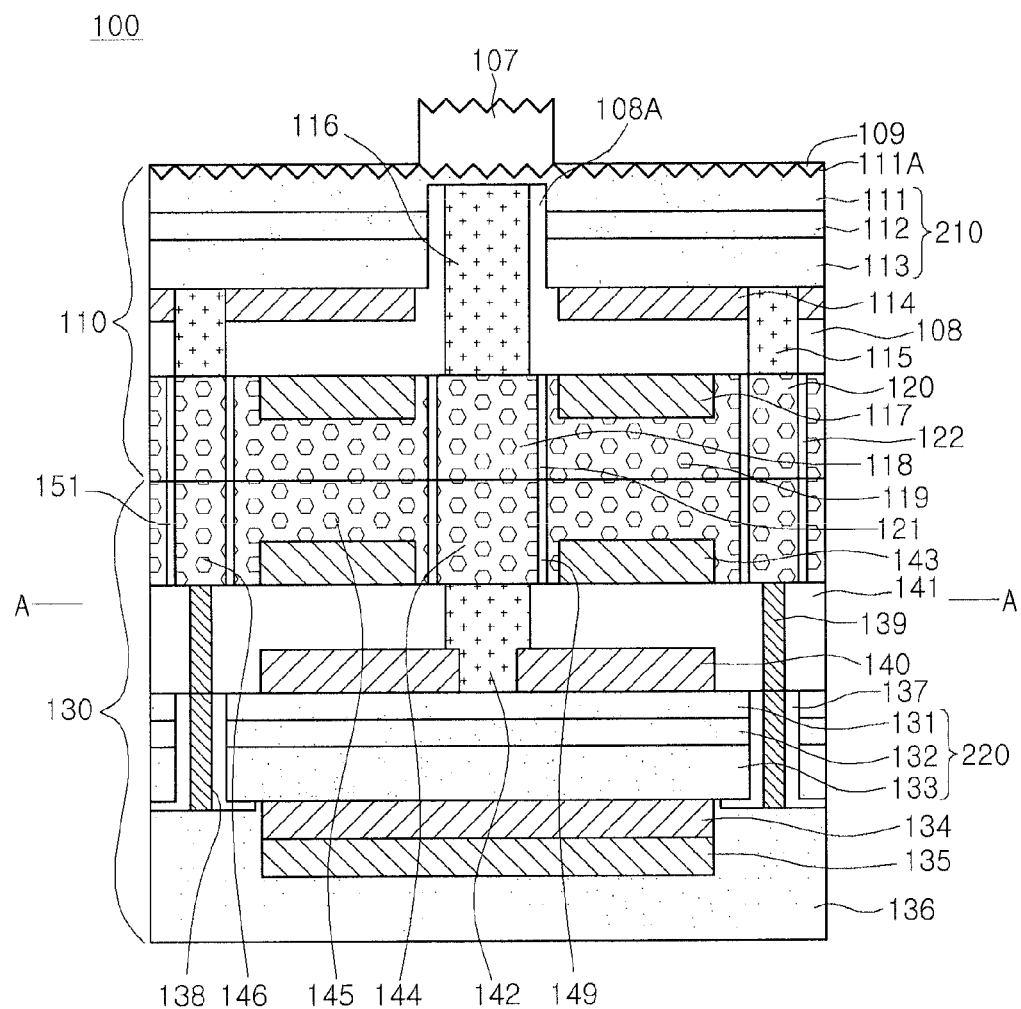
FIG. 1 is a side-sectional view of a light emitting device according to an embodiment.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

FIG. 1 is a side-sectional view of a light emitting device according to an embodiment.

Referring to FIG. 1, a light emitting device 100 includes at least two chip structures 110 and 130. In the light emitting device 100, one or plurality of second chip structures 130 may be disposed on at least one first chip structure 110. Also, one or plurality of second chip structures 130 may be disposed on the plurality of first chip structures 110. In the light emitting device 100, the plurality of chip structures 110 and 130 may be stacked in two or three layers. Here, each of the chip structures 110 and 130 may have the same width as each other or widths different from each other. Also, the chip structures 110 and 130 within the light emitting device 100 may emit light having the same wavelength as each other or wavelengths different from each other. Hereinafter, for convenience of descriptions, a structure in which the first chip structure 110 and the second chip structure 130 are vertically laminated to each other will be described as an example.

Each of the chip structures 110 and 130 may include a light emitting structure layer for emitting light and an electrode for supplying a power the light emitting structure layer. The term "chip structure" is used as a term for the descriptions, and thus, the embodiment is not limited to the term. Alternatively, the term may be changed into other terms such as a light emitting part, a chip part, a light emitting cell, or a device part. Hereinafter, for convenience of descriptions, the term "chip structure" will be used as an example.

Also, the first chip structure 110 may be disposed on at least portion of the second chip structure 130, and at least portion of a side surface of each of the structures 110 and 130 may have a stepped structure, but are not limited thereto.

The first chip structure 110 of the light emitting device 100 is disposed on an upper portion of the device and includes a first electrode 107. The second chip structure 130 is disposed under the first chip structure 110 and includes a support member 136.

The first chip structure 110 includes a first light emitting structure layer 210, a first conductive layer 114, a first insulation layer 108, a first connection member 115, a second connection member 116, a first reflective layer 117, and a first bonding layer 119.

The second chip structure 130 includes the support member 136, a second reflective layer 135, a second conductive layer 134, a second light emitting structure layer 220, a third conductive layer 140, a third connection member 139, a fourth connection member 142, a fifth connection member 138, a third reflective layer 143, a second insulation layer 141, and a second bonding layer 145.

The first light emitting structure 210 includes a first conductive type semiconductor layer 111, a first active layer 112, and a second conductive type semiconductor layer 113. The first active layer 112 is disposed between the first conductive type semiconductor layer 111 and the second conductive type semiconductor layer 113.

The first conductive type semiconductor layer 111 may be formed of a Group III-V compound semiconductor, which is doped with a first conductive type dopant. The first conductive type semiconductor layer 111 may formed of at least one selected from the group consisting of GaN, AlN, AlGaN, InGaN, InN, InAlGaN, AlInN, AlGaAs, GaP, GaAs, GaAsP, and AlGaInP. The first conductive type semiconductor layer 111 may be formed of a semiconductor material having a compositional formula of $In_xAl_yGa_{1-x-y}N$ ($0 \leq x \leq 1$, $0 \leq y \leq 1$, $0 \leq x+y \leq 1$). The first conductive type semiconductor layer 111 may include an N-type semiconductor layer. The N-type semiconductor layer may be doped with an N-type dopant such as Si, Ge, Sn, or Te. The first conductive type semiconductor layer 111 may have a single- or multi-layered structure, but is not limited thereto.

The first conductive type semiconductor layer 111 may have a supperlattice structure in which semiconductor layers different from each other are stacked on each other. The supperlattice structure may include a GaN/InGaN structure or a GaN/AlGaN structure. The supperlattice structure may include a structure in which at least two pairs or more of two layers, each having a thickness of several Å or more, different from each other are alternately stacked on each other. Alternatively, the supperlattice structure may include at least two layers having band gaps different from each other.

The first active layer 112 may be disposed under the first conductive type semiconductor layer 111. The first active layer 112 may have one of a single quantum well structure, a multi quantum well (MQW) structure, a quantum wire structure, and a quantum dot structure. The first active layer 112 may be formed at a cycle of a well layer/barrier layer using a Group III-V compound semiconductor material. For example, the first active layer 112 may have at least one of an InGaN/GaN structure, an InGaN/AlGaN structure, and an InGaN/InGaN structure. The barrier layer may be formed of a material having a band gap greater than that of the well layer, but is not limited thereto.

A light extraction structure 111A may be disposed on a top surface of the first conductive type semiconductor layer 111. The light extraction structure may include polygonal patterns such as triangular patterns. Alternatively, the light extraction structure 111A may have an uneven structure formed on the top surface of the first conductive type semiconductor layer 111 or be formed of a different material.

A first conductive type clad layer may be disposed between the first conductive type semiconductor layer 111 and the first active layer 112. The first conductive type clad layer may be formed of a GaN-based semiconductor. The first conductive type clad layer may have a band gap greater than that of the barrier layer within the first active layer 112 and confine carriers.

A second conductive type clad layer may be disposed between the first active layer 112 and the second conductive type semiconductor layer 113. The second conductive type clad layer may be formed of a GaN-based semiconductor. The second conductive type clad layer may have a band gap greater than that of the barrier layer within the first active layer 112 and confine carriers.

The second conductive type semiconductor layer 113 may be disposed under the first active layer 112. The second conductive type semiconductor layer 113 may be formed of a Group III-V compound semiconductor, which is doped with a second conductive type dopant. The second conductive type semiconductor layer 113 may be formed of at least one selected from the group consisting of GaN, AlN, AlGaN, InGaN, InN, InAlGaN, AlInN, AlGaAS, GaP, GaAs, GaAsP, and AlGaInP. The second conductive type semiconductor layer 113 may be formed of a semiconductor material having a compositional formula of $In_xAl_yGa_{1-x-y}N$ ($0 \leq x \leq 1$, $0 \leq y \leq 1$, $0 \leq x+y \leq 1$).

The second conductive type semiconductor layer 113 may have a single- or multi-layered structure. When the second conductive type semiconductor layer 113 has the multi-layered structure, the second conductive type semiconductor layer 113 may have a supperlattice structure such as an AlGaN/GaN structure or a stacked structure of layers having dopant concentrations different from each other.

The second conductive type semiconductor layer 113 may be a P-type semiconductor layer. The P-type semiconductor layer contains a P-type dopant such as Mg, Be, or Zn. The second conductive type semiconductor layer 113 may serve as an electrode contact layer, but is not limited thereto. An under surface of the second conductive type semiconductor layer 113 may have a light extraction structure, but is not limited thereto.

The first conductive type semiconductor layer 111 of the first light emitting structure layer 210 may have a thickness greater than that of the second conductive type semiconductor layer 113, but is not limited thereto.

A third conductive type semiconductor layer may be disposed under the second conductive type semiconductor layer 113. The third conductive type semiconductor layer may be a semiconductor layer having a polarity opposite to that of the second conductive type semiconductor layer 113. The first light emitting structure layer 210 may have one of an N-P junction structure, a P-N junction structure, an N-P-N junction structure, and a P-N-P junction structure. Here, the reference symbol "N" represents an N-type semiconductor layer, the reference symbol "P" represents a P-type semiconductor layer, and the reference symbol "-" represents a structure in which two semiconductor layers are directly or indirectly stacked on each other. Hereinafter, a structure in which the second conductive type semiconductor layer 113 is disposed on the lowermost layer of the first light emitting structure layer 210 will be described as an example.

A third insulation layer 109 may be disposed on the first conductive type semiconductor layer 111. The third insulation layer 109 may be disposed on a top surface of the device as well as a side surface of the device, but is not limited thereto.

At least one of a metal layer and a metal oxide layer may be disposed on the top surface of the first conductive type semiconductor layer 111.

The first electrode 107 is connected to an upper portion of the first conductive type semiconductor layer 111. At least one first electrode 107 may be disposed on the first conductive type semiconductor layer 111. The first electrode 107 may include a pad or an arm electrode connected to the pad. A transmissive material may be formed on the first conductive type semiconductor layer 111. The first electrode 107 may be disposed on at least portion of the transmissive material. The first electrode 107 may be electrically connected to the first conductive type semiconductor layer 111 or/and the transmissive material.

The first electrode 107 may be formed of one of Cu, Ti, Cr, Ta, Al, In, Pd, Co, Ni, Ge, Ag, and Au, or a metal in which a plurality of materials are mixed, but is not limited thereto.

At least one surface of top and lower surfaces of the first electrode 107 may have an uneven surface. The uneven surface may change a critical angle of incident light.

The first conductive layer 114 may be disposed under the second conductive type semiconductor layer 113. The first conductive layer 114 may be used as a transmissive electrode layer. The first conductive layer 114 may be formed of a conductive oxide-based material or conductive nitride-based material. The first conductive layer 114 may be formed of at least one selected from the group consisting of indium tin oxide ITO), indium zinc oxide (IZO), indium zinc tin oxide (IZTO), indium aluminum zinc oxide (IAZO), indium gallium zinc oxide (IGZO), indium gallium tin oxide (IGTO), aluminium zinc oxide (AZO), antimony tin oxide (ATO), IZO Nitride (IZON), ZnO, IrOx, RuOx, and NiO. Alternatively, the first conductive layer 114 may be formed of a material selected from Ag, Ni, Al, Rh, Pd, Ir, Ru, Mg, Zn, Pt, Au, Hf, and combinations thereof.

The first insulation layer 108 is disposed under the first conductive layer 114. The first insulation layer 108 may be formed of a transmissive insulation material such as $SiO_2$, $Si_3N_4$, $Al_2O_3$, or $TiO_2$, but is not limited thereto. At least one surface of top and lower surfaces of the first conductive layer 114 may have a roughness surface, but is not limited thereto.

The first insulation layer 108 may have a predetermined thickness for emitting light. An emission angle of the light emitted from the first chip structure 110 may be changed due to the thickness of the first insulation layer 108. For example, the first insulation layer 108 may have a thickness of about 1 μm or more, and particularly, a thickness of about 5 μm or more. The first insulation layer 108 may serve as a spacer for securing a vertical space within the first chip structure 110. In addition, the first insulation layer 108 may restrict light losses due to a thickness of the first chip structure 110.

The first connection member 115 and the second connection member 116 are disposed on the first insulation layer 108. The first connection member 115 and the second connection member 116 may be defined as conductive connection members, which vertically connect the layers to each other. The conductive connection member may have a through structure, a via structure, or a through hole structure. Hereinafter, for convenience of descriptions, the connection member will be described as an example.

Each of the first connection member 115 and the second connection member 116 may have a circular shape or a polygonal shape when viewed from a top side. The first connection member 115 may have a diameter or width different from that of the second connection member 116, or may have the same diameter or width as that of the second connection member 116, but is not limited thereto. The number of the first connection member 115 may be different from that of the second connection member 116. For example, the number of the second connection member 116 may be less than, equal to, or greater than that of the first connection member 115, but is not limited thereto.

Each of the first connection member 115 and the second connection member 116 may be formed of at least one selected from the group consisting of Pt, Ni, Rh, Ti, Al, In, Ta, Pd, Co, Ni, Si, Ge, Ag, and Au, or alloys thereof, but is not limited thereto. In the above-described connection member, a position and number of the first connection member 115 may be provided in one or plurality to supply a power. Also, the first connection member 115 may have a line structure or a loop structure, but is not limited thereto.

The first connection member 115 is provided in plurality. The plurality of first connection members 115 may be disposed under the second conductive type semiconductor layer 113 and spaced from each other. Also, the plurality of first connection members 115 passes through the inside of the first insulation layer 108.

The first connection member 115 electrically connects the second conductive type semiconductor layer 113 to a first intermediate connection member 120 of the first bonding layer 119. The second connection member 116 electrically connects the first conductive type semiconductor layer 111 to a second intermediate connection member 118 of the first bonding layer 119.

The first connection member 115 contacts the first conductive layer. The first conductive layer 114 diffuses a current applied through the first connection member 115.

The second connection member 116 is connected to a lower portion of the first conductive type semiconductor layer 111 and passes through the inside of the first insulation layer 108. A position of the second connection member 116 may be vertically missed with that of the first electrode 107. The second connection member 116 may be changed in diameter and number, but is not limited thereto.

Here, a portion 108A of the first insulation layer 108 is disposed in a groove, which exposes the first conductive type semiconductor layer 111 through the inside of the second conductive type semiconductor layer 113 and the first active layer 112. Also, the first insulation layer 108 insulates a circumference of the second connection member 116.

The first bonding layer 119 and the first reflective layer 117 are disposed under the first insulation layer 108. The first reflective layer 117 reflects light incident through the first insulation layer 108. The first reflective layer 117 may have a roughness surface to extract light.

The first reflective layer 117 may have a single- or multi-layered structure. The first reflective layer 117 may be formed of at least one selected from the group consisting of Ag, Al, Rh, Pd, Ir, Ru, Mg, Zn, Pt, Au, Hf, and a combination thereof. The first reflective layer 117 may be embedded in an upper portion of the first bonding layer 119. A top surface of the first reflective layer 117 may be exposed from the first bonding layer 119. Also, the first reflective layer 117 may be disposed on a top surface of the first bonding layer 119, but is not limited thereto. The first reflective layer 117 may have a width less than or equal to that of the light emitting device 100, but is not limited thereto.

The first intermediate connection member 120 and the second intermediate connection member 118 are disposed on the first bonding layer 119. The first intermediate connection member 120 corresponds to the first connection member 115. The first intermediate connection member 120 may have a diameter greater than that of the first connection member 115 to contact the first intermediate connection members 120 with the first connection member 115, but is not limited thereto. The second intermediate connection member 118 corresponds to the second connection member 116. The second intermediate connection member 118 may have a diameter greater than that of the second connection member 116 to contact the second intermediate connection members 118 with the second connection member 115, but is not limited thereto.

Insulation materials 122 and 121 are disposed around the first intermediate connection member 120 and the second intermediate connection member 118. The insulation materials 122 and 121 may be formed of one selected from the materials of the first insulation layer 108, but is not limited thereto.

The first and second bonding layer 119 and 145 include a metallic layer.

The first bonding layer 119 may be bonded using a single- or multi-layered metal for a eutectic process. The eutectic metal may be bonded using an alloy such as Au/Sn, SnPb, or Pb-free solder through the eutectic process.

The first bonding layer 119 is bonded on the second bonding layer 145 of the second chip structure 130.

The second bonding layer 145 may be bonded using a single- or multi-layered metal for a eutectic process (hereinafter, referred to as a eutectic metal). The eutectic metal may be bonded using an alloy such as Au/Sn, SnPb, or Pb-free solder through the eutectic process. Alternatively, each of the first and second bonding layers 119 and 145 may be formed as an insulative adhesion layer. The insulative adhesion layer may not include an insulation layer for insulating the intermediate connection members 118, 120, 146, and 144 from each other therein. The first and second bonding layers 119 and 145 may be formed of a metal or non-metal material having high conductivity to discharge heat to the outside.

The third intermediate connection member 146 and the fourth intermediate connection member 144 are disposed on the second bonding layer 145. The third intermediate connection member 146 corresponds to the first intermediate connection member 120 of the first bonding layer 119. The third intermediate connection member 146 contacts the first intermediate connection member 120. The fourth intermediate connection member 144 corresponds to the second intermediate connection member 118 of the first bonding layer 119. The fourth intermediate connection member 114 contacts the second intermediate connection member 118.

Insulation materials 151 and 149 are disposed around the third intermediate connection member 146 and the fourth intermediate connection member 144. The insulation materials 151 and 149 may be formed of one selected from the materials of the first insulation layer 108, but is not limited thereto.

The third reflective layer 143 is disposed under the second bonding layer 145. The third reflective layer 143 may be formed of one selected from the materials of the first reflective layer 117. The third reflective layer 143 is disposed under the second bonding layer 145. Also, the third reflective layer 143 may be disposed in a region except the intermediate connection members 144 and 146 to reflect light.

The third reflective layer 143 may be embedded in a lower portion of the second bonding layer 145. An under surface of the third reflective layer 143 may be exposed from the second bonding layer 145. Also, the second reflective layer 143 may be disposed under an under surface of the second bonding layer 145, but is not limited thereto.

The second insulation layer 141 may be disposed under the second bonding layer 145 and the third reflective layer 143. The second insulation layer 141 may be formed of one selected from the materials of the first insulation layer 108.

The second insulation layer 141 may have a predetermined thickness. The second light emitting structure layer 220 may provide a space through which light emitted upwardly from the second light emitting structure layer 220 is horizontally emitted. The second insulation layer 141 may have a thickness enough to secure a space between the second light emitting structure layer 220 and the second bonding layer 145 to effectively emit light emitted from the second light emitting structure layer 220. For example, the second insulation layer 141 may have a thickness of about 1 μm or more, and particularly, a thickness of about 5 μm or more.

The second insulation layer 141 includes the third connection member 139 and the fourth connection member 142.

Each of the third connection member 139 and the fourth connection member 142 may be formed of at least one selected from the group consisting of Pt, Ni, Rh, Ti, Al, In, Ta, Pd, Co, Ni, Si, Ge, Ag, and Au, or alloys thereof, but is not limited thereto. The above-described connection members may be defined as conductive connection members, which vertically connect the layers to each other. Each of the connection members may have a through structure, via structure, or a through hole structure. Hereinafter, for convenience of descriptions, the connection member will be described as an example.

The third connection member 139 electrically contacts the third intermediate connection member 146 of the second bonding layer 145. The fourth connection member 142 electrically contacts the fourth intermediate connection member 144 of the second bonding layer 145.

The third connection member 139 and the fourth connection member 142 may have a position and diameter in consideration of each contact degree of the third intermediate connection member 146 and the fourth intermediate connection member 144.

The third conductive layer 140 is disposed under the second insulation layer 141. The third conductive layer 140 may ohmic-contact the third conductive type semiconductor layer 131. The third conductive layer 140 contacts the fourth connection member 142 and diffuses a current applied from the fourth connection member 142. The third conductive layer 140 may be not provided, but is not limited thereto. Also, a roughness that is a light extraction structure or a predetermined pattern may be disposed on the third conductive layer 140 or the third reflective layer 143.

The second light emitting structure layer 220 is disposed under the third conductive layer 140. The second light emitting structure layer 220 may include a plurality of semiconductor layers formed of a Group III-V compound semiconductor. For example, the second light emitting structure layer 220 may be formed of at least one selected from the group consisting of GaN, AlN, AlGaN, InGaN, InN, InAlGaN, AlInN, AlGaAs, GaP, GaAs, GaAsP, and AlGaInP. The second light emitting structure layer 220 may be formed of a Group III-V nitride semiconductor having a compositional formula of $In_xAl_yGa_{1-x-y}N$ ($0 \leq x \leq 1$, $0 \leq y \leq 1$, $0 \leq x+y \leq 1$), but is not limited thereto. The second light emitting structure layer 220 includes the third conductive type semiconductor layer 131, a fourth conductive type semiconductor layer 133, and a second active layer 132 between the third conductive type semiconductor layer 131 and the fourth conductive type semiconductor layer 133.

The second active layer 132 may have one of a single quantum well structure, a multi quantum well (MQW) structure, a quantum dot structure, and a quantum wire structure. The second active layer 132 may be formed at a cycle of a well layer/barrier layer formed of a Group III-V compound semiconductor material. The barrier layer may be formed of a material having a band gap greater than that of the well layer. The cycle of the well layer/barrier layer may have an InGaN/GaN structure, an InGaN/AlGaN structure, or an InGaN/InGaN structure, but is not limited thereto.

Here, the third conductive type may be an N-type semiconductor, and the fourth conductive type may be a P-type semiconductor. Also, the N-type semiconductor layer or the P-type semiconductor layer may be disposed under the fourth conductive type semiconductor layer 133. The third conductive type semiconductor layer 131 may include a semiconductor layer having the same polarity as that of the first conductive type semiconductor layer 111, and the fourth conductive type semiconductor layer 133 may include a semiconductor layer having the same polarity as that of the second conductive type semiconductor layer 112.

The third conductive type semiconductor layer 131 of the second light emitting structure layer 220 may have a thickness at least greater than that of the fourth conductive type semiconductor layer 133, but is not limited thereto. A light extraction structure such as an unevenness or roughness may be further disposed on a top surface of the third conductive type semiconductor layer 131.

Each layer of the second light emitting structure layer 220 will be described with reference to each layer of the first light emitting structure layer 210. The second light emitting structure layer 220 may have one of an N-P junction structure, a P-N junction structure, an N-P-N junction structure, and a P-N-P junction structure. The other layer may be added between the layers, but is not limited thereto.

The second conductive layer 134 may be disposed under the fourth conductive type semiconductor layer 133. The second conductive layer 134 may be formed of a transparent electrode material. The second conductive layer 134 may ohmic-contact an under surface of the fourth conductive type semiconductor layer 133 and serve as a current diffusion layer. A roughness may be formed on an under surface of the second conductive layer 134, but is not limited thereto.

The second reflective layer 135 is disposed under the second conductive layer 134. The second reflective layer 135 may have a single- or multi-layered structure and be formed of at least one selected from the group consisting of Ag, Ni, Al, Rh, Pd, Ir, Ru, Mg, Zn, Pt, Au, Hf, and a combination thereof. The second reflective layer 135 may be formed in a roughness shape. The second reflective layer 135 may have an area greater than the under surface of the second conductive layer 134 to increase a reflective effect, but is not limited thereto.

Each of the second conductive layer 134 and the second reflective layer 135 may have a width equal to or less than that of the support member 136. Also, at least one of the second conductive layer 134 and the second reflective layer 135 may have the same width as that of the light emitting device, but is not limited thereto.

The fifth connection member 138 is disposed on the second light emitting structure layer 220. The fifth connection member 138 is disposed at a position corresponding to that of the third connection member 139 to electrically contact the third connection member 139. The fifth connection member 138 may be formed of one selected from the materials of the above-described connection members. The fifth connection member 138 may have a number and diameter in consideration of a contact area and electrical characteristics with the third connection member 139.

The fifth connection member 138 passes through the second light emitting structure layer 220, and an insulation material 137 is disposed around the fifth connection member 138. The insulation material 137 prevents the fifth connection member 138 from being electrically short-circuited to other layers 131, 132, and 133. The insulation material 137 may extend up to an under surface of the fourth conductive type semiconductor layer 133, but is not limited thereto.

The fifth connection member 138 may be electrically connected to at least one of the fourth conductive type semiconductor layer 133, the third conductive layer 134, the second reflective layer 135, and the support member 136. The fifth connection member 138 may be connected to the second reflective layer 135 or/and the support member 136.

The support member 136 is disposed under the third reflective layer 135. The support member 136 may be used as a conductive support member. The support member 136 is disposed at a device base side. The support member 136 may be formed of Cu, Au, Ni, Mo, Cu—W, or carrier wafer such as Si, Ge, GaAs, ZnO, and SiC. The support member 136 may be formed by electrolytic plating or in a sheet shape, but is not limited thereto. The support member 136 may be used as a path through which a power having second polarity is supplied. Alternatively, the support member 136 may include an insulative member. In this case, a power may be supplied through the other side surface or a via structure.

A power having first polarity is supplied to the first electrode 107 of the first chip structure 110. The power having the second polarity is supplied to the support member 136 of the second chip structure 130.

The power having the first polarity may be supplied to the first conductive type semiconductor layer 111 and the third conductive type semiconductor layer 131 through the second connection member 116, the second intermediate connection member 118, the fourth intermediate connection member 144, and the fourth connection member 142.

The power having the second polarity is supplied to the support member 16. Also, the power having the second polarity is supplied to the second conductive type semiconductor layer 113 via the first connection member 115 through the fifth connection member 138, the third connection member 139, the third intermediate connection member 146 of the second bonding layer 145, and the first intermediate connection member 120 of the first bonding layer 119. Thus, the first and second active layers 112 and 132 may emit light.

The first light emitting structure layer 210 of the first chip structure 110 may be parallely connected to the second light emitting structure layer 220 of the second chip structure 130 to improve light efficiency. Also, since the first chip structure 110 and the second chip structure 130 are connected in parallel, the other light emitting structure may be normally operated even though any one of the light emitting structure layers is defective. In the current embodiment, the first chip structure 110 may be connected to the second chip structure 130 in series. In this case, the first chip structure 110 and the second chip structure 130 may be connected to each other with an N-P-N-P junction structure.

The plurality of semiconductor layers 111, 112, and 113 within the first chip structure 110 and the plurality of semiconductor layers 131, 132, and 133 within the second chip structure 130 may be parallely connected to each other by the plurality of connection members vertically arranged within the light emitting device. Alternatively, the connection members may connect the plurality of semiconductor layers 111, 112, and 113 within the first chip structure 110 to the plurality of semiconductor layers 131, 132, and 133 within the second chip structure 130 with respect to the same polarity as each other or polarities opposite to each other. The polarity may be an N-type semiconductor layer or a P-type semiconductor layer.

The first light emitting structure layer 210 may emit first light, and the second light emitting structure layer 220 may emit the first light or second light different from the first light. For example, the first light may include light having blue, green, red, or ultraviolet (UV) wavelength, and the second light may include blue, yellow, violet, green, red, or UV light.

Figure 2:
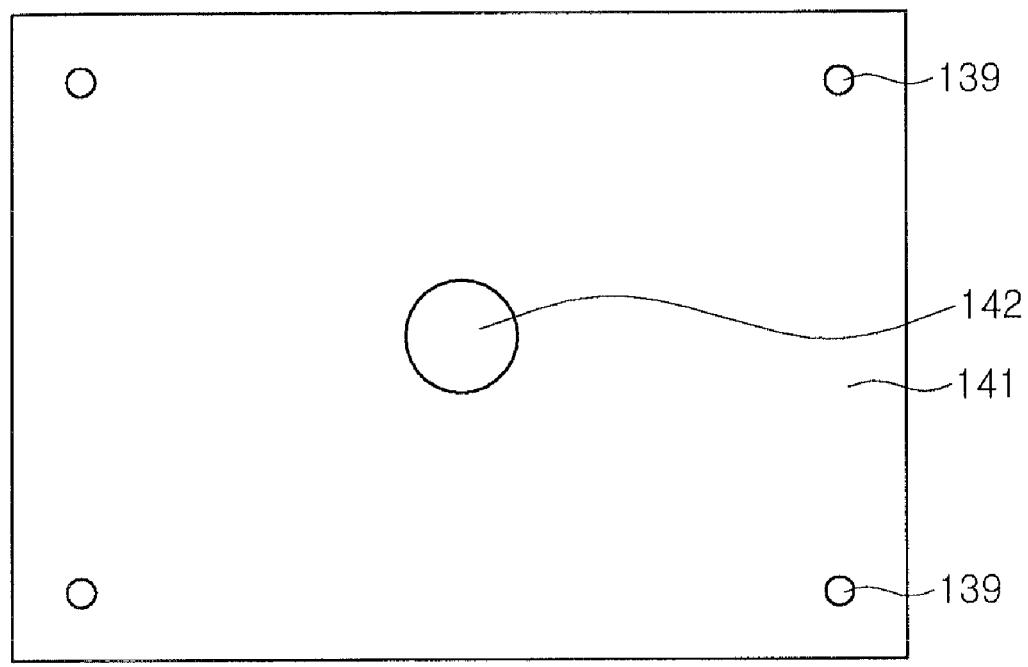
FIG. 2 is a side-sectional view taken along line A-A of FIG. 1.

FIG. 2 is a side-sectional view taken along line A-A of FIG. 1.

Referring to FIG. 2, in the second insulation layer 141, a plurality of third connection members 139 is disposed in edge regions, respectively. The fourth connection member 142 is disposed in a center region. The third connection member 139 may have a circular or polygonal shape. Alternatively, the third connection member 139 may have a ring shape, i.e, an open loop or a close loop shape.

Figure 3:
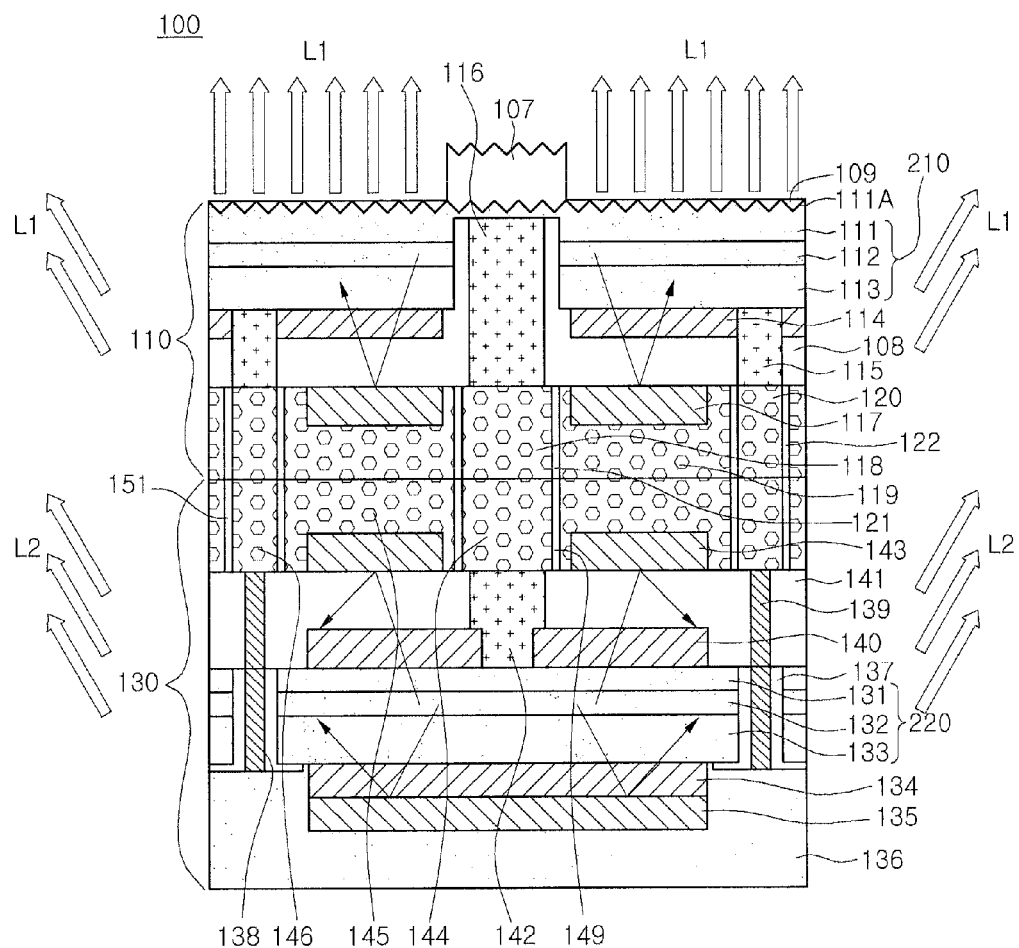
FIG. 3 is a view illustrating an example of light emission of the light emitting device of FIG. 1.

The fourth connection member 142 may have at least one of circular, polygonal, and branch structures FIG. 3 is a view illustrating an example of light emission of the light emitting device of FIG. 1.

Referring to FIG. 3, the first chip structure 110 and the second chip structure 130 are connected to each other in parallel. Thus, the first chip structure 110 and the second chip structure 130 may be substantially operated at the same time.

The first light emitting structure layer 210 emits first light L1. The first light L1 is emitted in total directions except a downward direction. Here, a portion of the first light L1 may be laterally and upwardly reflected by the first reflective layer 117 and emitted.

The first light L1 of the first light emitting structure layer 210 may have at least one of green, red, yellow, and UV wavelength bands. Second light L2 emitted from the second light emitting structure layer 220 may have at least one of green, red, yellow, and UV wavelength bands.

The second chip structure 130 may laterally radiate the second light L2 emitted from the second light emitting structure layer 220. The third reflective layer 143 and the second reflective layer 135 of the second chip structure 130 reflect the second light L2 emitted from the second active layer 132 to improve light extraction efficiency.

The light emitting device 100 may emit white light. For example, red or green light may be emitted through the second chip structure 130, and blue light may be emitted through the first chip structure 110. Thus, the white light may be emitted by mixing the plurality of colors. Since the white light is emitted, a phosphor may not be separately added to a molding member sealing the light emitting device chip on the package. In the current embodiment, the first and second active layers 112 and 132 may emit light having wavelengths different from each other or light having the same wavelength as each other, but is not limited thereto.

According to the current embodiment, a package including the light emitting device 100 of FIG. 1 may be provided. In the package, when the light emitting device of FIG. 1 emits blue light, at least one kind of phosphor may be added. In this case, a light intensity may be one and half times or more than that of the other chip having the same size. Also, when the light emitting device of FIG. 1 emits light having a plurality of colors, target light (e.g., white light) may be realized through the plurality of colors on the package. A separate phosphor may not be added to the molding member, kinds of phosphor may be reduced.

FIGS. 4 to 23 are views illustrating a process of manufacturing a light emitting device according to an embodiment. A process of manufacturing a first chip structure will be described with reference to FIGS. 4 to 7.

Figure 4:
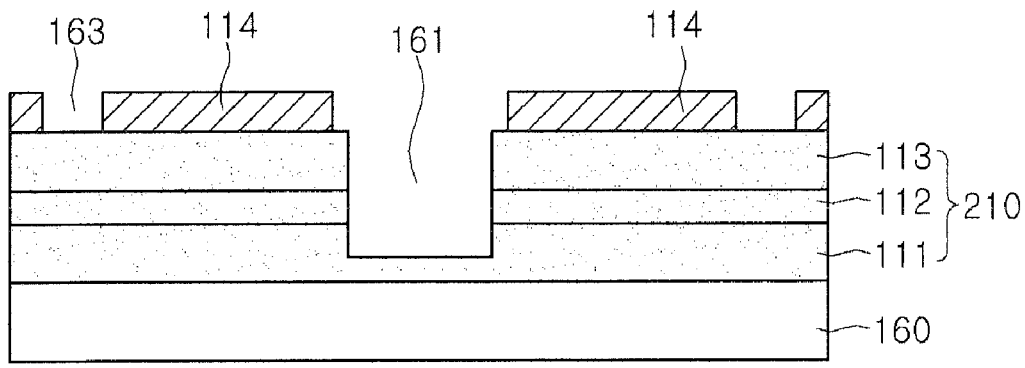
FIGS. 4 to 23 are views illustrating a process of manufacturing a light emitting device according to an embodiment.
Figure 5:
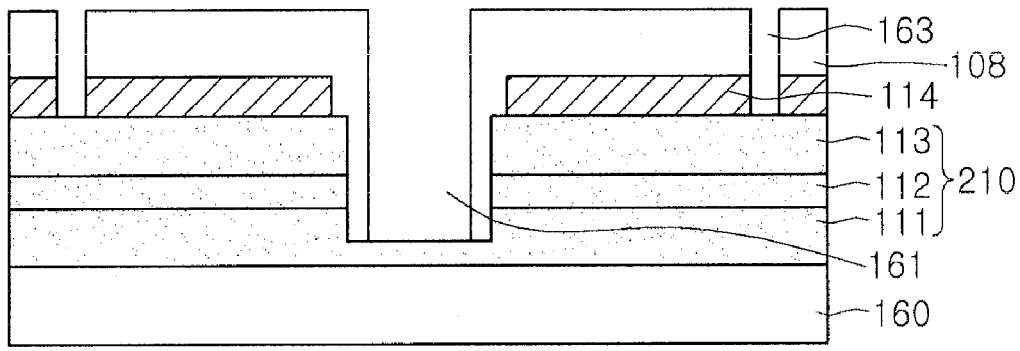

Referring to FIGS. 4 and 5, a first growth substrate 160 is loaded on growth equipment, and a first light emitting structure layer 210 formed of a plurality of compound semiconductor is formed on the first growth substrate 160. The growth equipment may include an E-beam evaporator, physical vapor deposition (PVD), chemical vapor deposition (CVD), plasma laser deposition (PLD), a dual-type thermal evaporator, sputtering, and metal organic chemical vapor deposition (MOCVD), but is not limited thereto.

The first growth substrate 160 may be formed of one selected from sapphire ($Al_2O_3$), GaN, SiC, ZnO, Si, GaP, InP, GaAs, and $Ga_2O_3$. A roughness (not shown) may be formed on the first growth substrate 160. The roughness may have a hemisphere shape or a stripe shape.

The first light emitting structure layer 210 may be formed on the first growth substrate 160. A layer or structure for reducing a lattice constant difference or improving light extraction efficiency using the other semiconductor, e.g., a Group II to VI compound semiconductor (e.g., ZnO, GaN) may be disposed between the first growth substrate 160 and the first light emitting structure layer 210 and may be formed in an uneven pattern or roughness.

Also, a buffer layer or/and undoped semiconductor layer may be formed on the first growth substrate 160. The buffer layer may be formed of at least one selected from the group consisting of GaN, AlN, AlGaN, InGaN, InN, InAlGaN, AlInN, AlGaAs, GaP, GaAs, GaAsP, and AlGaInP using a Group III-V compound semiconductor. The undoped semiconductor layer has conductivity less than that of the first conductive type semiconductor layer. The undoped semiconductor layer may be formed of a GaN-based semiconductor and have an N-type semiconductor characteristic.

The first light emitting structure layer 210 includes a first conductive type semiconductor layer 111, a first active layer 112, and a second conductive type semiconductor layer 113. The first conductive type semiconductor layer 111 may be formed of a Group III-V compound semiconductor, which is doped with a first conductive type dopant, e.g., at least one selected from the group consisting of GaN, AlN, AlGaN, InGaN, InN, InAlGaN, AlInN, AlGaAs, GaP, GaAs, GaAsP, and AlGaInP. The first conductive type semiconductor layer 111 may include an N-type semiconductor layer. The N-type semiconductor layer may be doped with an N-type dopant such as Si, Ge, Sn, Se, or Te. The first active layer 112 may have one of a single quantum well structure, a multi quantum well (MQW) structure, a quantum dot structure, and a quantum wire structure, which are formed using a Group III-V compound semiconductor on the first conductive type semiconductor layer 111. For example, the first active layer 112 may be formed at a cycle of an InGaN well layer/GaN barrier layer. The well layer may be formed of a material having a band gap less than that of the barrier layer.

A second conductive type semiconductor layer 113 is formed on the first active layer 112. The second conductive type semiconductor layer 113 may be formed of one of a compound semiconductor, which is doped with a second conductive type dopant, e.g., at least one selected from the group consisting of GaN, InN, AlN, InGaN, AlGaN, InAlGaN, AlInN, AlGaAs, GaP, GaAs, GaAsP, and AlGaInP. The second conductive type semiconductor layer 113 may be a P-type semiconductor layer, and the P-type semiconductor layer may include a P-type dopant such as Mg, Zn, Ca, Sr, or Ba.

A layer disposed more adjacent to the first growth substrate 160 of the first conductive type semiconductor layer 111 and the second conductive type semiconductor layer 113 of the first light emitting structure layer 210 may become thickener.

In the first light emitting structure layer 210, the first conductive type may be realized as an N-type semiconductor, and the second conductive type may be realized as a P-type semiconductor, or vice versa. A semiconductor layer having a polarity opposite to that of the second conductive type may be formed on the second conductive type semiconductor layer 113. Thus, the first light emitting structure layer 210 may have one of an N-P junction structure, a P-N junction structure, an N-P-N junction structure, and a P-N-P junction structure.

The first conductive layer 114 may be disposed on the second conductive type semiconductor layer 113. The first conductive layer 114 may be formed of at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminium zinc oxide (AZO), antimony tin oxide (ATO), IZO Nitride (IZON), ZnO, IrOx, RuOx, and NiO. Alternatively, the first conductive layer 114 may be formed of a material selected from Ag, Ni, Al, Rh, Pd, Ir, Ru, Mg, Zn, Pt, Au, Hf, and combinations thereof.

A masking process may be performed using a mask pattern to form the first conductive layer 114 in a region in which the mask pattern is not formed. At least one first hole 163 is formed in the first conductive layers 114. At least one second hole 161 is formed in the first conductive layers 114.

An etch process is performed on the first light emitting structure layer 210 to expose a portion of the first conductive type semiconductor layer 111. A second hole 161 is formed by the etch process. The second hole 161 may be formed at a position corresponding to that of the second connection member (see reference numeral 116 of FIG. 6) of the second chip structure. In the etch process, the masking process may be performed using the mask pattern, and then, the first conductive type semiconductor layer 111 may be dry-etched in a desired region until the first conductive type semiconductor layer 111 is exposed. Here, an order of the etch process and the process of forming the first conductive layer 114 may be exchanged, and a wet etch process may be performed as the etch process.

Figure 6:
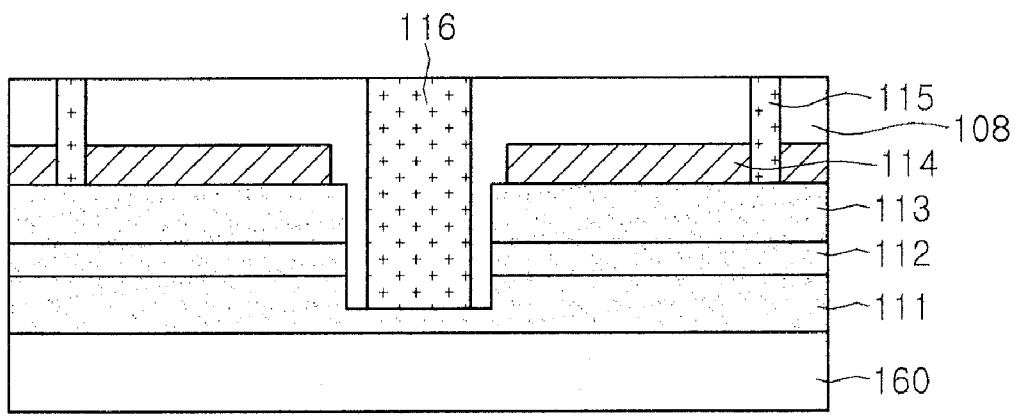

Referring to FIGS. 5 and 6, a first insulation layer 108 is formed on the first conductive layer 114. The first insulation layer 108 may be formed of an insulation material such as $SiO_2$, $Si_3N_4$, $Al_2O_3$, or $TiO_2$, but is not limited thereto.

In the formation of the first insulation layer 108, the first hole 163 and the second hole 161 may be formed after the masking process is performed using the mask pattern (e.g., photoresist pattern).

A first connection member 115 and a second connection member 116 are formed in the first hole 163 and the second hole 161, respectively. The first connection member 115 electrically contacts the second conductive type semiconductor layer 113 and the first conductive layer 114. The second connection member 116 electrically contacts the first conductive type semiconductor layer 111 and is insulated from the other layer by the first insulation layer 108. An order of the formation of the connection members 115 and 116 and the first insulation layer 108 may be exchanged with each other, but is not limited thereto. The first connection member 115 and the second connection member 116 are formed through a plating process after a deposition or sputtering process is performed, but is not limited thereto.

The first connection member 115 and the second connection member 116 may be formed of at least one selected from the group consisting of Pt, Ni, Rh, Ti, Al, In, Ta, Pd, Co, Ni, Si, Ge, Ag, and Au, or alloys thereof, but is not limited thereto. The above-defined connection members may be defined as members, which electrically connect the layers to each other. Each of the connection member may have a through structure, a via structure, or a through hole structure. Hereinafter, for convenience of descriptions, the connection member will be described as an example.

The first connection member 115 and the second connection member 116 may be variously varied in configuration and number within technical scope to the embodiment, and the present disclosure is not limited to these structures. Here, the connection members 115 and 116 may be provided in plurality or have branched structures to improve current supply efficiency. In addition, each of the connection members 115 and 116 may have an adequate size in consideration of light extraction efficiency.

Figure 7:
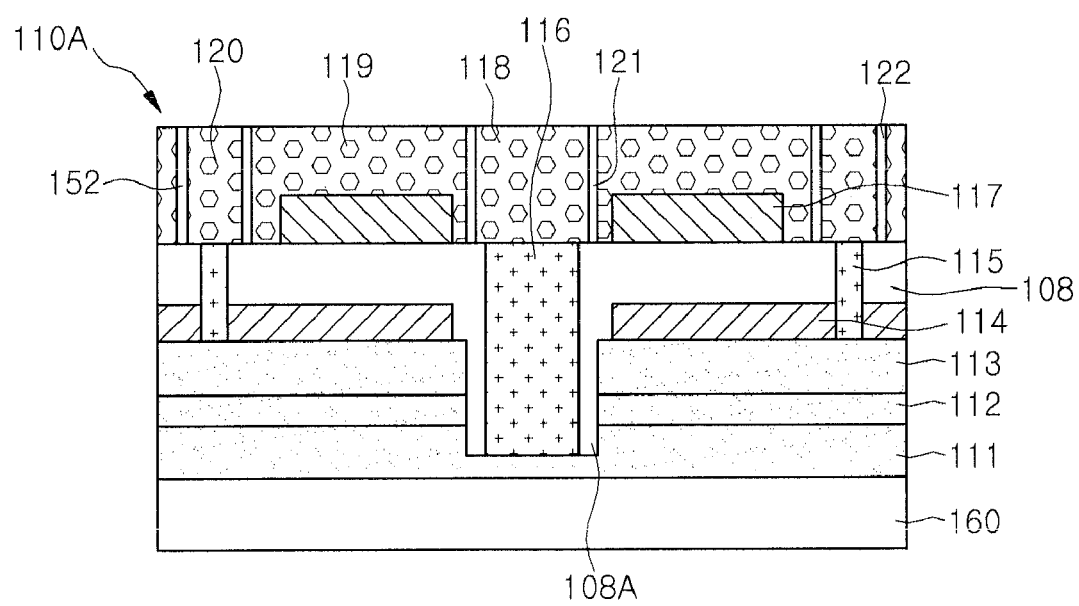

Referring to FIGS. 6 and 7, a first reflective layer 117 is formed on the first insulation layer 108, and a first bonding layer 119 is formed on the first reflective layer 117. The first reflective layer 117 may be formed of one of the above-described metal materials. In addition, the first reflective layer 117 may include a reflective metal with a content of at least 50% or more. The first reflective layer 117 may be electrically separated from the first connection member 115 and the second connection member 116. The first reflective layer 117 may be formed using a deposition, sputtering, or plating process, but is not limited thereto.

A first intermediate connection member 120 and a second intermediate connection member 118 are disposed within the first bonding layer 119. An insulation material is disposed around the first intermediate connection member 120 and the second intermediate connection member 118 to electrically separate the first and second intermediate connection members 120 and 118 from the other material.

The first bonding layer 119 includes a metallic layer. The first bonding layer 119 may be bonded using a single- or multi-layered metal for a eutectic process (hereinafter, referred to as a eutectic metal). The eutectic metal may be bonded using an alloy such as Au/Sn, SnPb, or Pb-free solder through the eutectic process.

The first intermediate connection member 120 of the first bonding layer 119 is electrically connected to the first connection member 115, and the second intermediate connection member 118 is electrically connected to the second connection member 116. Thus, a first chip structure 100A emitting first light may be formed. In the formation of the first chip structure 110A, the connection member and the intermediate connection member may be formed after a hole is formed using a laser or drilling process to insulate the hole using an insulation material. However, the present disclosure is not limited to the formation process of the connection member.

FIGS. 8 to 16 are views illustrating a process of forming a second chip structure.

Figure 8:
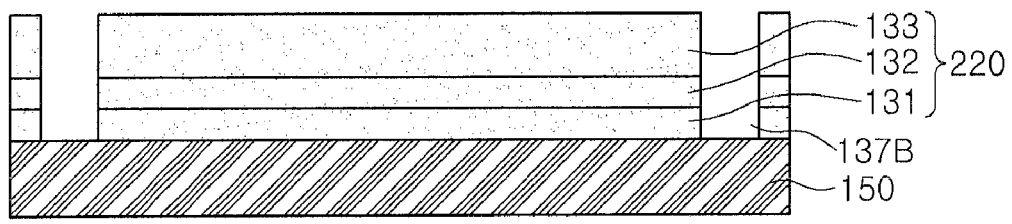
Figure 9:
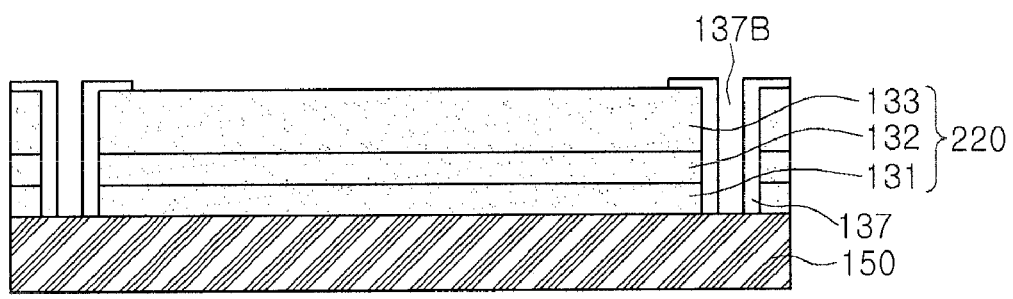

Referring to FIGS. 8 and 9, a second growth substrate 150 is loaded on growth equipment, and a second light emitting structure layer 220 formed of a plurality of compound semiconductor is formed on the second growth substrate 150. The growth equipment may include an E-beam evaporator, physical vapor deposition (PVD), chemical vapor deposition (CVD), plasma laser deposition (PLD), a dual-type thermal evaporator, sputtering, and metal organic chemical vapor deposition (MOCVD), but is not limited thereto.

The second growth substrate 150 may be formed of one selected from sapphire ($Al_2O_3$), GaN, SiC, ZnO, GaP, InP, GaAs, and $Ga_2O_3$. A roughness (not shown) may be formed on the second growth substrate 150. The roughness may be formed into a dot- or lens-shaped pattern or a stripe-shaped pattern.

The second light emitting structure layer 220 may be formed on the second growth substrate 150. A layer or structure for improving a crystal structure and light extraction efficiency using the other semiconductor, e.g., a Group II to VI compound semiconductor (e.g., ZnO, GaN) may be disposed between the second growth substrate 150 and the second light emitting structure layer 220 and may be formed in an uneven pattern or roughness.

Also, a buffer layer or/and undoped semiconductor layer may be formed on the second growth substrate 150. The buffer layer may be formed of at least one selected from the group consisting of GaN, AlN, AlGaN, InGaN, InN, InAlGaN, AlInN, AlGaAs, GaP, GaAs, GaAsP, and AlGaInP using a Group III-V compound semiconductor. The undoped semiconductor layer has conductivity less than that of the first conductive type semiconductor layer. The undoped semiconductor layer may be formed of a GaN-based semiconductor and have an N-type semiconductor characteristic.

The second light emitting structure layer 220 includes a third conductive type semiconductor layer 131, a second active layer 132, and a fourth conductive type semiconductor layer 133. The third conductive type semiconductor layer 131 may be formed of a Group III-V compound semiconductor, e.g., at least one selected from the group consisting of GaN, AlN, AlGaN, InGaN, InN, InAlGaN, AlInN, AlGaAs, GaP, GaAs, GaAsP, and AlGaInP. The second light emitting structure layer 220 may be formed of a semiconductor material having a compositional formula of $In_xAl_yGa_{1-x-y}N$ ($0 \leq x \leq 1$, $0 \leq y \leq 1$, $0 \leq x+y \leq 1$). The third conductive type semiconductor layer 131 may include an N-type semiconductor layer. The N-type semiconductor layer may be doped with an N-type dopant such as Si, Ge, Sn, Se, or Te.

The second active layer 132 may have one of a single quantum well structure, a multi quantum well (MQW) structure, a quantum dot structure, and a quantum wire structure, which are formed using a Group III-V compound semiconductor on the third conductive type semiconductor layer 131. The well layer may be formed of a material having a band gap less than that of the barrier layer. The first active layer 112 and the second layer 132 may be formed of the same material as each other or materials different from each other and may have the same band gap as each other or band gaps different from each other.

A fourth conductive type semiconductor layer 133 is formed on the second active layer 132. The fourth conductive type semiconductor layer 133 may be formed of one of a compound semiconductor, which is doped with a second conductive type dopant, e.g., at least one selected from the group consisting of GaN, InN, AlN, InGaN, AlGaN, InAlGaN, AlInN, AlGaAs, GaP, GaAs, GaAsP, and AlGaInP. The fourth conductive type semiconductor layer 133 may be a P-type semiconductor layer, and the P-type semiconductor layer may include a P-type dopant such as Mg, Zn, Ca, Sr, or Ba.

A layer disposed more adjacent to the second growth substrate 150 of the third conductive type semiconductor layer 131 and the fourth conductive type semiconductor layer 133 of the second light emitting structure layer 220 may become thickener.

The third conductive type of the second light emitting structure layer 220 may be realized as an N-type semiconductor, and the fourth conductive type may be realized as a P-type semiconductor, or vice versa. A semiconductor layer having a polarity opposite to that of the fourth conductive type, e.g., an N-type semiconductor layer may be further formed on the fourth conductive type semiconductor layer 133. Thus, the second light emitting structure layer 220 may have one of an N-P junction structure, a P-N junction structure, an N-P-N junction structure, and a P-N-P junction structure.

At least one fifth hole 137B is formed in the second light emitting structure layer 220. The fifth hole 137B passes through the second light emitting structure layer 220. Also, the fifth hole 137B may have a depth at which the second growth substrate 150 is exposed or the fourth conductive type semiconductor layer 133 is etched.

An insulation material 137 is formed in the fifth hole 137B. The insulation material 137 may be formed of an insulation material such as $SiO_2$, $Si_3N_4$, $Al_2O_3$, or $TiO_2$, but is not limited thereto. The insulation material 137 may be formed using a deposition or sputtering process.

The fifth hole 137B is formed in the insulation material 137. A masking or etch process may be performed after or before the insulation material 137 is formed to form the fifth hole 137B, but is not limited thereto.

The insulation material 137 may extend to a circumference of a hole of the fourth conductive type semiconductor layer 133, but is not limited thereto.

Figure 10:
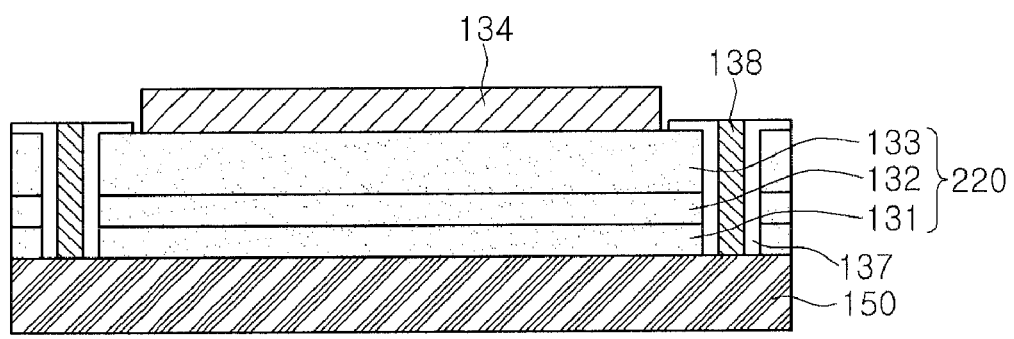

Referring to FIGS. 9 and 10, the second conductive layer 134 may be disposed on the fourth conductive type semiconductor layer 133. The second conductive layer 134 may be formed of at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminium zinc oxide (AZO), antimony tin oxide (ATO), IZO Nitride (IZON), ZnO, IrOx, RuOx, and NiO. Alternatively, the second conductive layer 134 may be formed of a material selected from Ag, Ni, Al, Rh, Pd, Ir, Ru, Mg, Zn, Pt, Au, Hf, and combinations thereof.

The second conductive layer 134 may be formed into a plurality of patterns or layers. The second conductive layer 134 may ohmic-contact the fourth conductive type semiconductor layer 133. Here, the second conductive layer 134 may not be provided.

A fifth connection member 138 is formed in the fifth hole 137B. The fifth connection member 138 may be formed of at least one selected from the group consisting of Pt, Ni, Rh, Ti, Al, In, Ta, Pd, Co, Ni, Si, Ge, Ag, and Au, or alloys thereof, but is not limited thereto. Here, the formation process of the fifth connection member 138 and the insulation material 137 may be exchanged with each other, but is not limited thereto.

Figure 11:
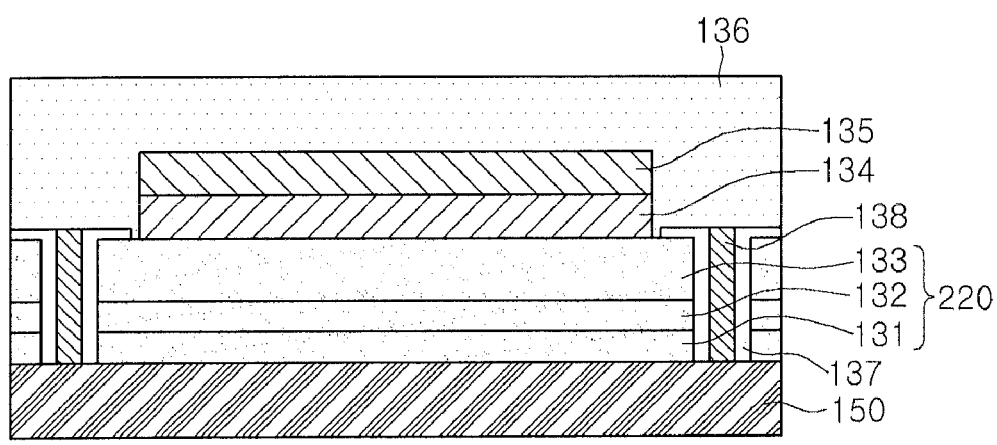

Referring to FIGS. 10 and 11, a second reflective layer 135 is formed on the first conductive layer 134, and a support member 136 is formed on the second reflective layer 135.

The second reflective layer 135 may be formed of at least one selected from the group consisting of Ag, Ni, Al, Rh, Pd, Ir, Mg, Zn, Pt, Au, Hf, and a combination thereof, but is not limited thereto. The second reflective layer 135 may extend to top surfaces of the insulation material 137 and the fifth connection member 138.

The second reflective layer 135 supplies a power having second polarity to reflect incident light. The support member 136 may be formed on the second reflective layer 134, the insulation material 137, and the fifth connection member 138.

The support member 136 may be formed as a conductive support member. For example, the support member 136 may be formed of Cu, Au, Ni, Mo, Cu—W, or carrier wafer such as Si, Ge, GaAs, ZnO, and SiC. The support member 136 may adhere using a plating method or into a plate shape, but is not limited thereto.

Figure 12:
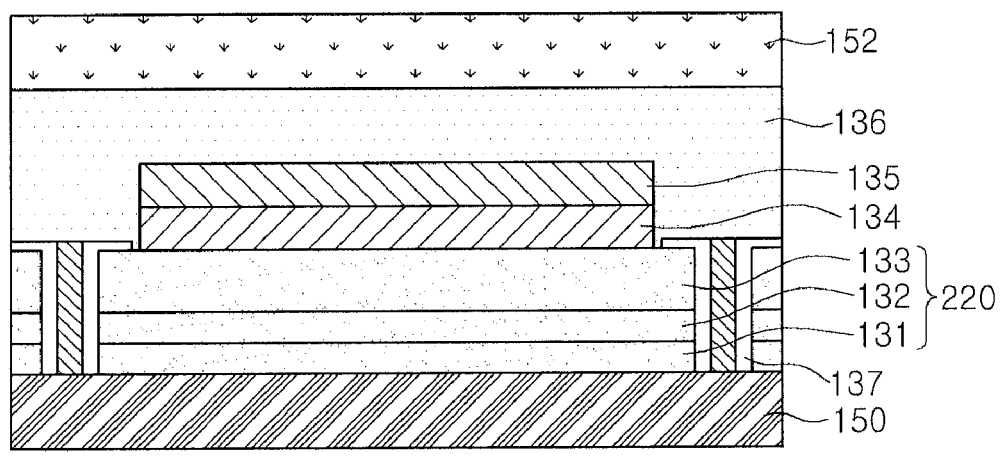

Referring to FIGS. 11 and 12, an elimination substrate 152 is formed on the support member 136. The elimination substrate 152 may be a grip substrate. The elimination substrate 152 may be formed of a substrate material such as glass or sapphire in which a laser lift off (LLO) process can be performed. The elimination substrate 152 may adhere or may be separately deposited, but is not limited thereto.

Figure 13:
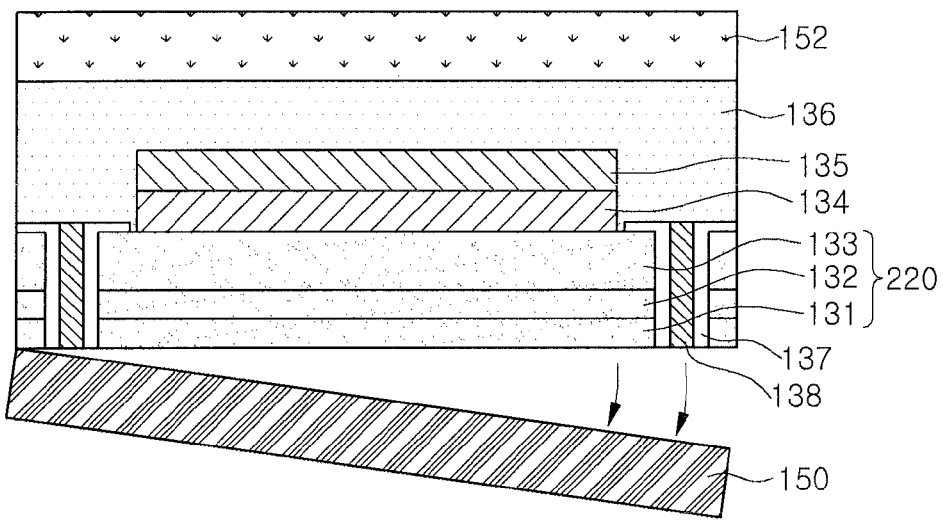

Referring to FIGS. 12 and 13, the second chip structure turns upside down, and then, the elimination substrate 152 is positioned at a base to remove the second growth substrate 150. The second growth substrate 150 may be removed using a laser lift off method in which a laser having a predetermined wavelength is irradiated onto the second growth substrate 150 or a chemical method such as a wet etch process, but is not limited thereto.

Figure 14:
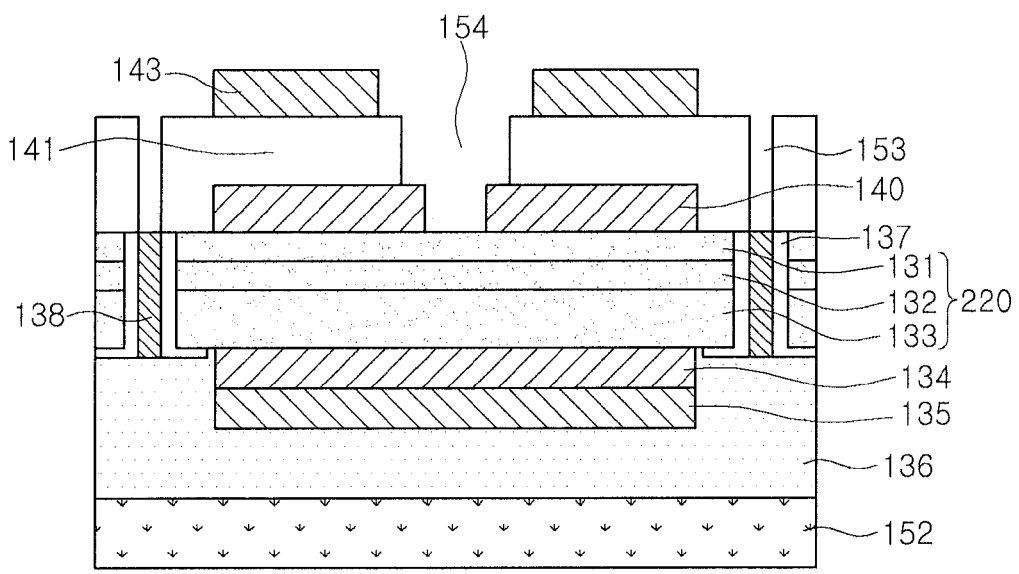

Referring to FIGS. 13 and 14, when the second growth substrate 150 is removed, a third conductive layer 140 is formed on a third conductive type semiconductor layer 131 of the second light emitting structure layer 220. Then, a second insulation layer 141 is formed on the third conductive layer 140.

The third conductive layer 140 may be formed into a layer or a plurality of patterns using a mask layer in a region except a hole of the connection member, but is not limited thereto.

The second insulation layer 141 may be formed on the third conductive layer 140 and the light emitting structure layer using an insulation material such as $SiO_2$, $Si_3N_4$, $Al_2O_3$, or $TiO_2$. However, the present disclosure is not limited to the material.

A third reflective layer 143 is formed on the second insulation layer 141. The third reflective layer 143 may reflect light transmitting the second insulation layer 141. A roughness (not shown) may be formed on a top surface of the second insulation layer 141. Since the third reflective layer 143 has a roughness surface, light extraction efficiency may be improved.

The second insulation layer 141 may provide a space in which light emitted from the second light emitting structure layer 220 is effectively emitted in a lateral direction. The second insulation layer 141 may laterally emit light, which may be lost into the chip, using a difference of refractive indexes of media adjacent to each other.

Third and fourth holes 153 and 154 are formed in the second insulation layer 141. The third hole 153 is formed corresponding to that of the fifth connection member 138. The fourth hole 154 may be formed to expose the third conductive type semiconductor layer 131. The fourth hole 154 may be formed to further expose a top surface of the third conductive layer 140, but is not limited thereto.

At least one third hole 153 may be defined around the device. At least one fourth hole 154 may be defined at a center of the device. The holes of the two connection members may be exchanged in position or have various disposition structures, but is not limited thereto.

Also, the third and fourth holes 153 and 154 may be formed using an etch process after or before the second insulation layer 141 is formed.

The third reflective layer 143 may be formed before or after the third and fourth holes 153 and 154 are formed, but is not limited thereto.

Figure 15:
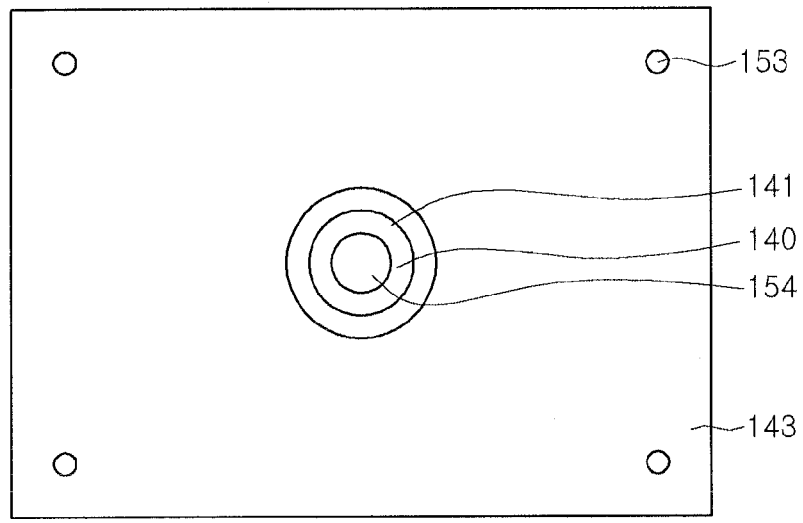

FIG. 15 is a plan view before the third reflective layer is formed in FIG. 14.

Referring to FIG. 15, the third and fourth holes 153 and 154 formed in the second insulation layer 141 may have the same size (e.g., diameter) or number as each other or sizes or numbers different from each other, but is not limited thereto.

The third hole 153 may have a ring shape, e.g., a close loop or open loop shape. Also, the third hole 153 may be formed in a varied arm form and a plurality of arm structure, but is not limited thereto.

Figure 16:
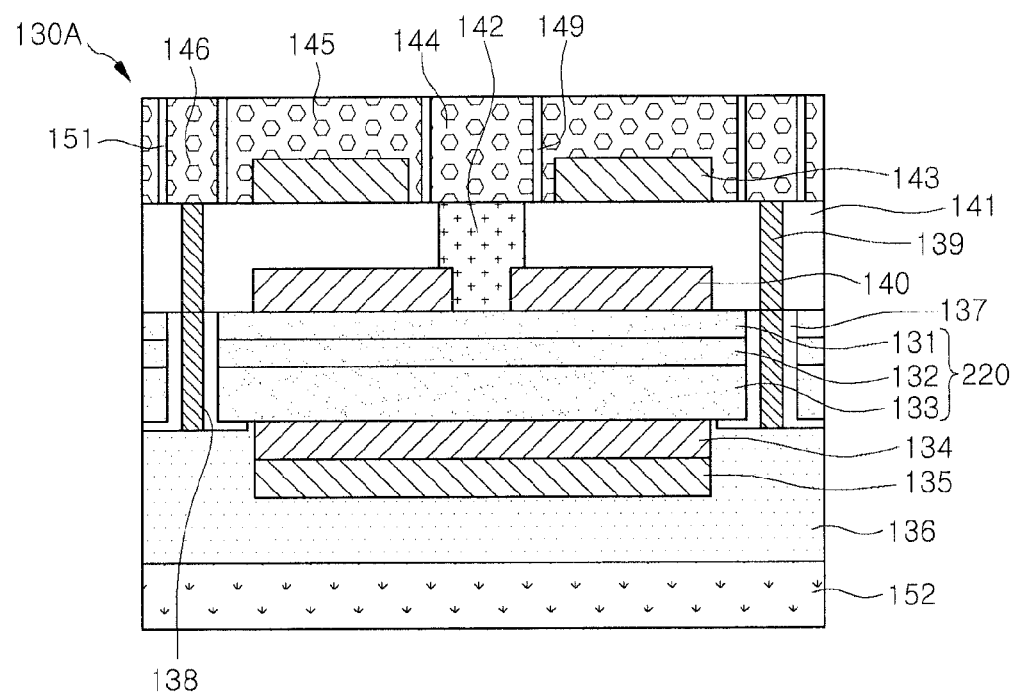

Referring to FIGS. 14 and 16, a third connection member 139 is formed in the third hole 153, and a fourth connection member 142 is formed in the fourth hole 154. The third and fourth connection members 139 and 142 may be formed by performing a masking process using a mask pattern and performing the same process or separate processes using an electrode material.

Each of the third connection member 139 and the fourth connection member 142 may have a thickness similar to or greater than that of the second insulation layer 141, but is not limited thereto. The fourth connection member 142 may have a lower diameter less than an upper diameter thereof, but is not limited thereto. The fourth connection member 142 may contact the third conductive layer 140. Thus, a current may be diffused through the third conductive layer 140.

A second bonding layer 145 is formed on the second insulation layer 141. The second bonding layer 145 may formed of a metal for a eutectic process, e.g., an alloy such as Au/Sn, SnPb, or Pb-free solder. Thus, a second chip structure 130A may be completed. In the formation of the second chip structure 130A, the connection member and the intermediate connection member may be formed after a hole is formed using a laser or drilling process to insulate the hole using an insulation material. However, the present disclosure is not limited to the formation process of the connection member.

In the formation of the second bonding layer 145, a third intermediate connection member 146 and a fourth intermediate connection member 144 may be formed on the second bonding layer 145 using the mask pattern. Alternatively, previously formed third and fourth intermediate connection members 146 and 144 may be provided on the second bonding layer 145.

The third connection member 139 electrically contact a lower portion of the third intermediate connection member 146, and the fourth connection member 142 electrically contact a lower portion of the fourth intermediate connection member 144.

The second bonding layer 145 may have a structure in which the third and fourth connection members 146 and 144 are electrically separated from each other. The electrically separated structure may be changed according to positions of the third and fourth connection members 139 and 142. The third and fourth intermediate connection members 146 and 144 may be insulated from the second bonding layer 145 by insulation materials 151 and 149 to prevent the third and fourth intermediate connection members 146 and 144 from being unnecessarily short-circuited.

The third and fourth intermediate connection members 146 and 144 may be formed using a drill or laser after the second bonding layer 145 is formed.

FIGS. 17 to 23 are views illustrating a process of manufacturing the light emitting device through a lamination of a plurality of chip structures.

Figure 17:
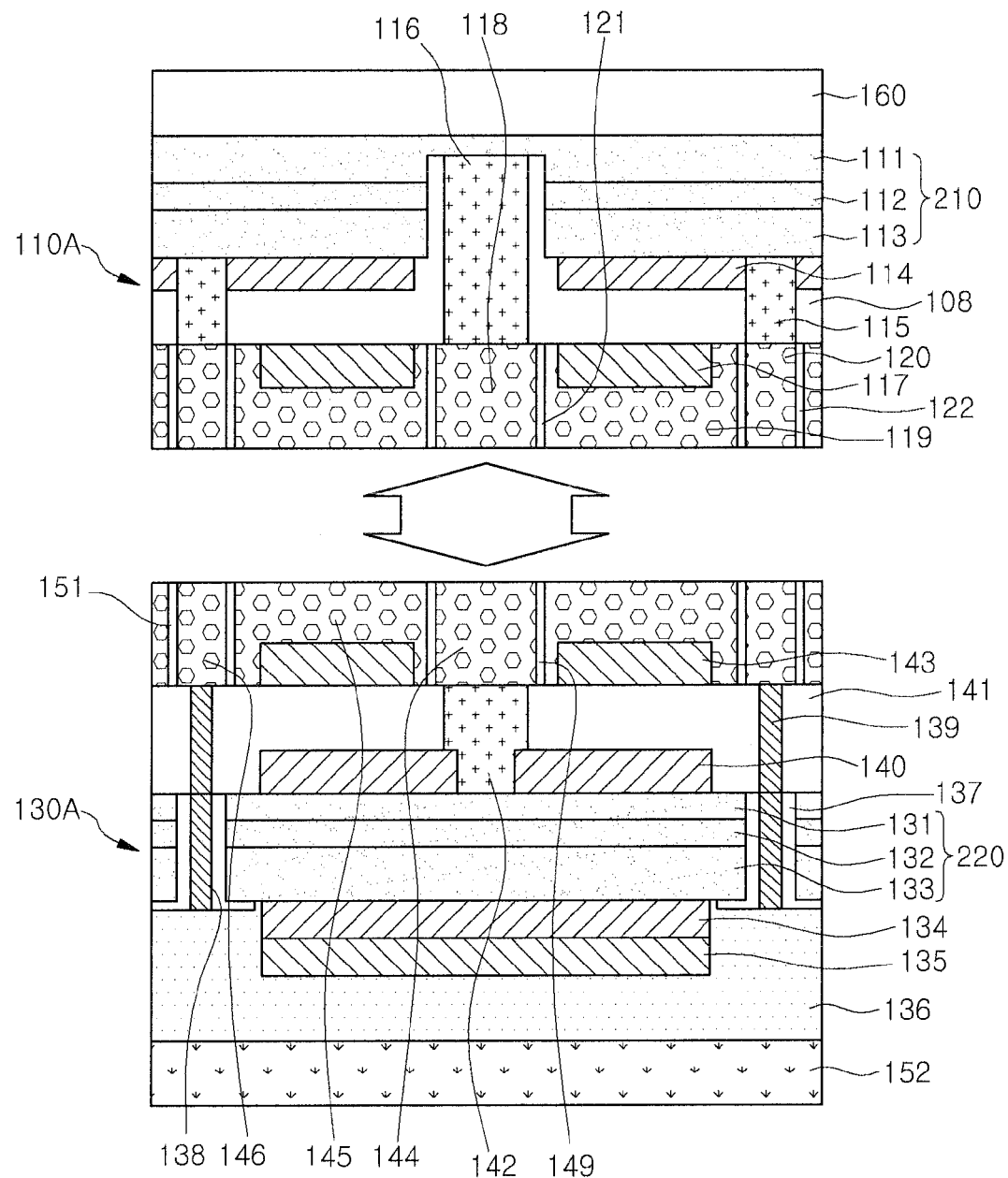

Referring to FIG. 17, the first chip structure 110A is disposed on the second chip structure 130A, and then, the second bonding layer 145 and the first bonding layer 119 are jointed to each other. In the junction of the second bonding layer 145 and the first bonding layer 119, the two layers are aligned. Thereafter, the first intermediate connection member 120 corresponds to the third intermediate connection member 146, and the second intermediate connection member 118 corresponds to the fourth intermediate connection member 144.

The second bonding layer 145 and the first bonding layer 119 may be aligned as described above, and therein the eutectic process may be performed to joint the second bonding layer 145 to the first bonding layer 119, but is not limited thereto.

When the second bonding layer 145 and the first bonding layer 119 are jointed to each other, the third intermediate connection member 146 of the second bonding layer 145 contacts the first intermediate connection member 120 of the first bonding layer 119. In addition, the fourth intermediate connection member 144 of the second bonding layer 145 contacts the second intermediate connection member 118 of the first bonding layer 119.

Figure 18:
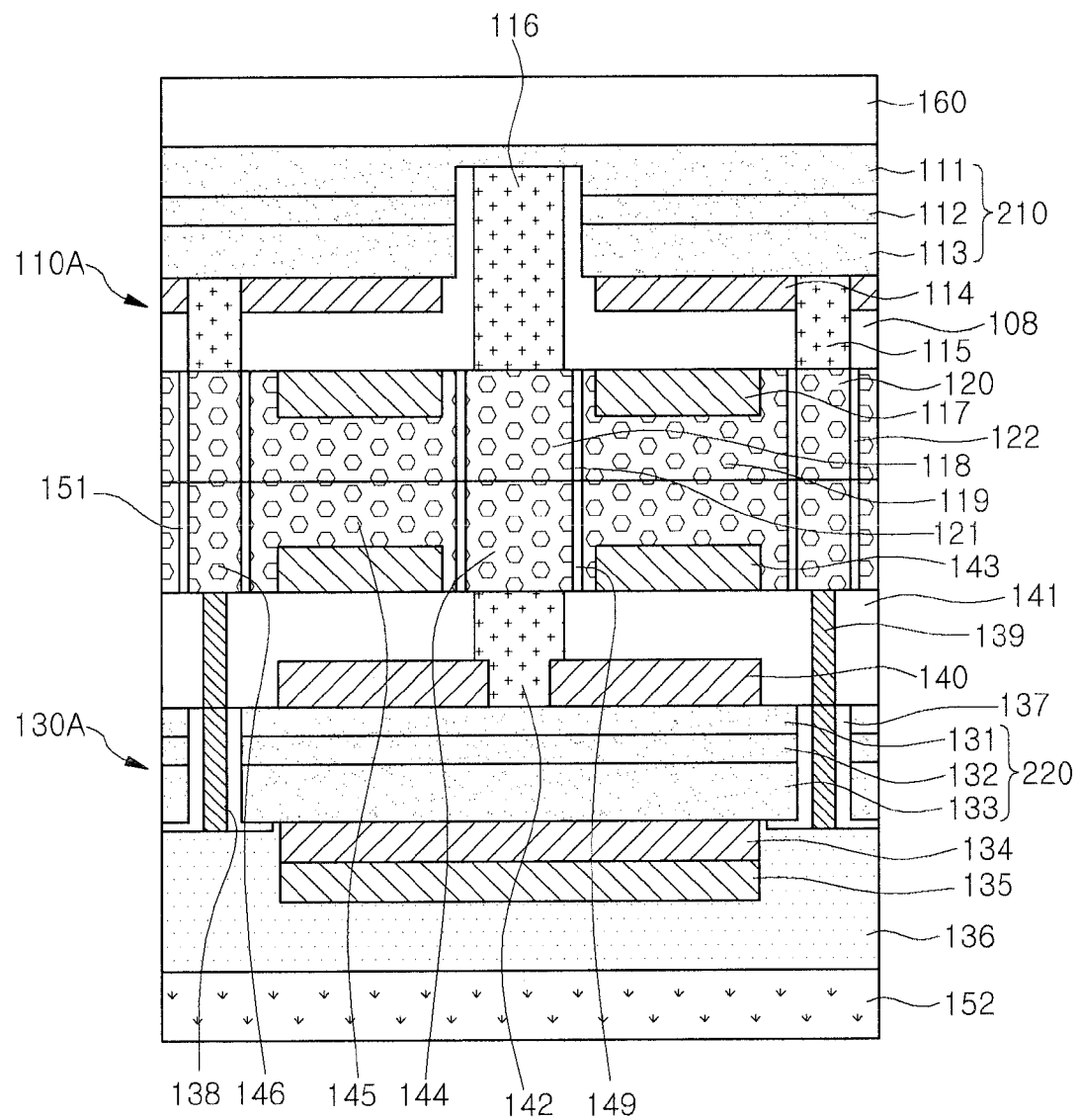
Figure 19:
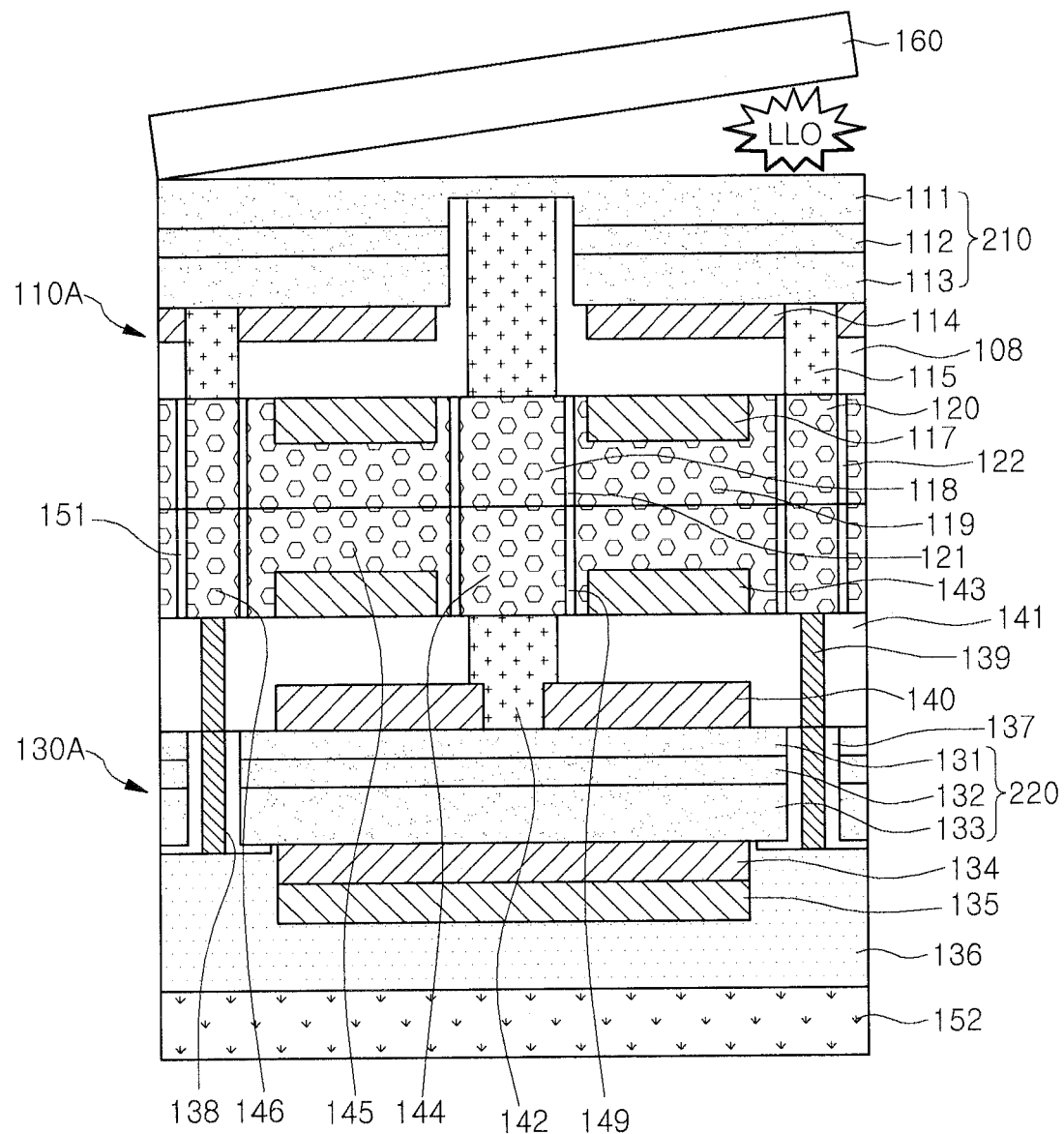

Referring to FIGS. 17 to 19, the first growth substrate 160 on the first chip structure 110A is removed. The first growth substrate 160 may be removed using a physical or/and chemical method(s). In the physical method, the LLO process may be performed to remove the first growth substrate 160. In the chemical method, wet etchant may be injected into a layer between the first growth substrate 160 and the first conductive type semiconductor layer 111 of the first light emitting structure 210 to remove the first growth substrate 160.

Figure 20:
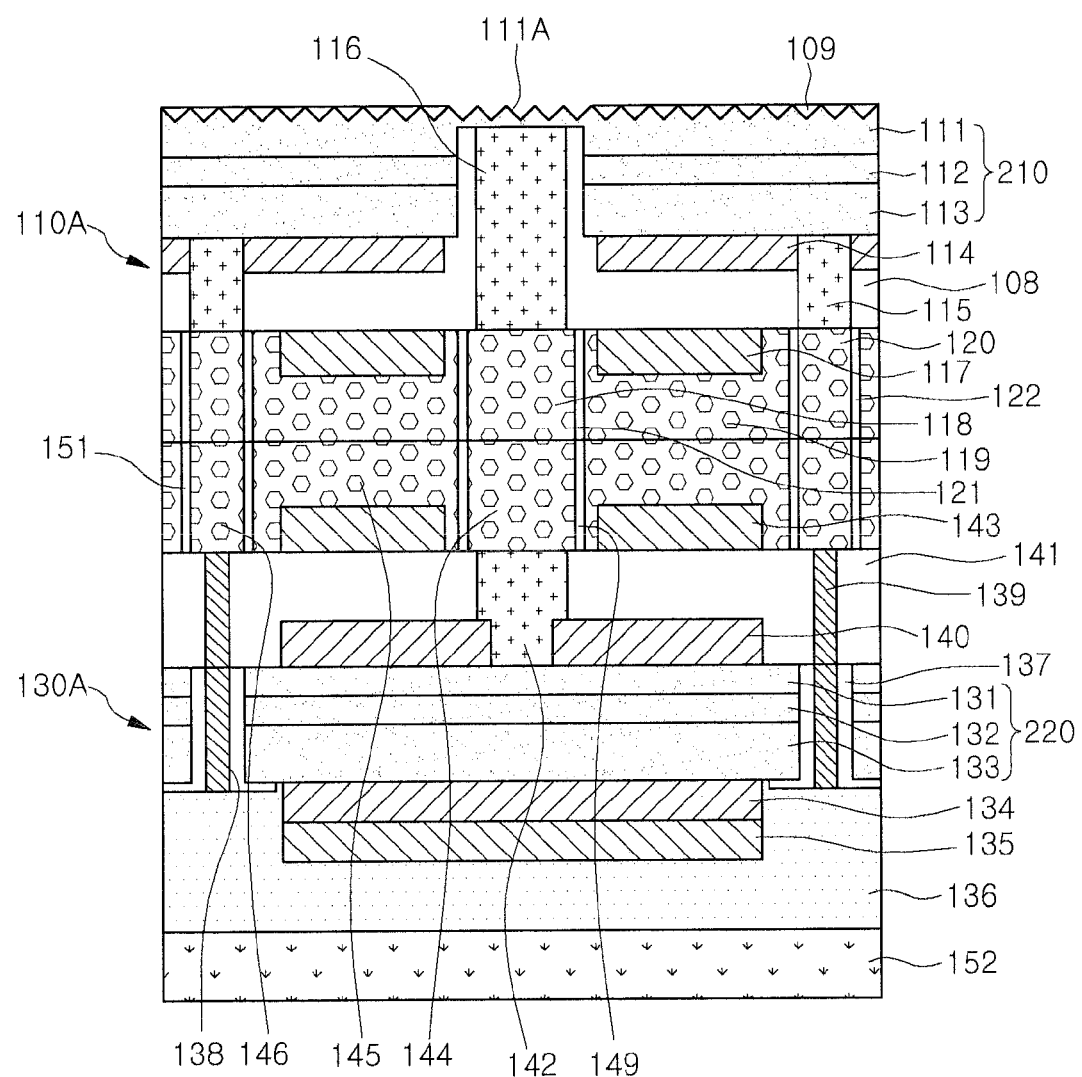

Referring to FIGS. 19 and 20, when the first growth substrate 160 of the first chip structure 110A is removed, a roughness 111A may be formed on a top surface of the first conductive type semiconductor layer 111 of the first light emitting structure 210 to form a structure, which can improve external quantum efficiency.

A third insulation layer 109 may be formed on the top surface of the first conductive type semiconductor layer 111 of the first chip structure 110A. The third insulation layer 109 may be formed on the top surface except a region of the first electrode 107, but is not limited thereto. Here, the third insulation layer 109 may be formed on the top surface of the light emitting device as well as on a periphery of the light emitting device. In this case, the light emitting structure layer 210 may be insulated from the second light emitting structure layer 220. In addition, the third insulation layer 109 may prevent moisture from being permeated.

The first electrode 107 is formed on the first conductive type semiconductor layer 111 of the first chip structure 110. The first electrode 107 may be formed in signal or plurality, or in a predetermined pattern having an arm shape. A roughness may be formed at a top surface of the first electrode 107. Here, a conductive layer (not shown) may be formed on a surface of the first conductive type semiconductor layer 111. Such an electrode layer may uniformly diffuse a current onto the entire surface.

Figure 21:
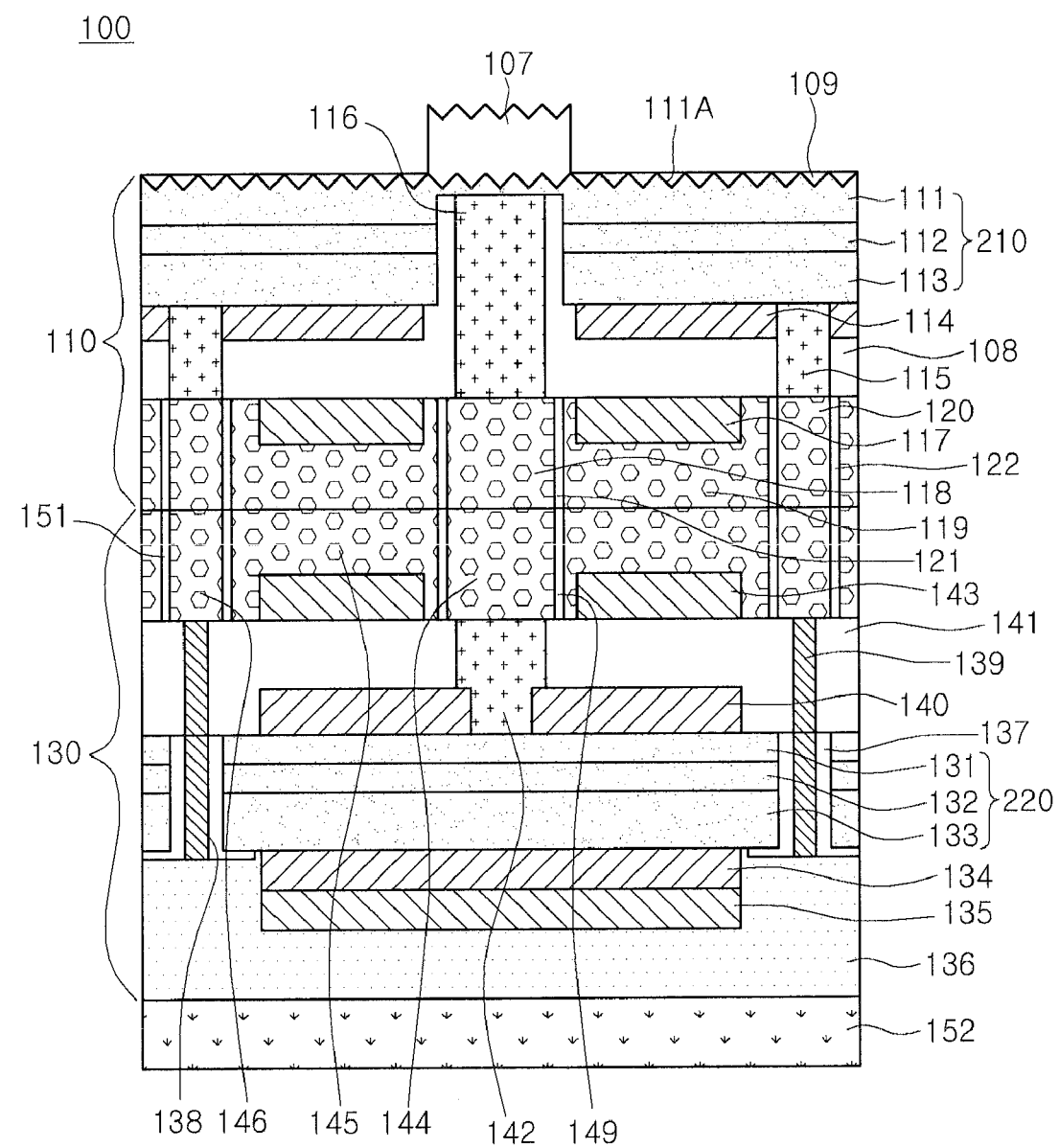
Figure 22:
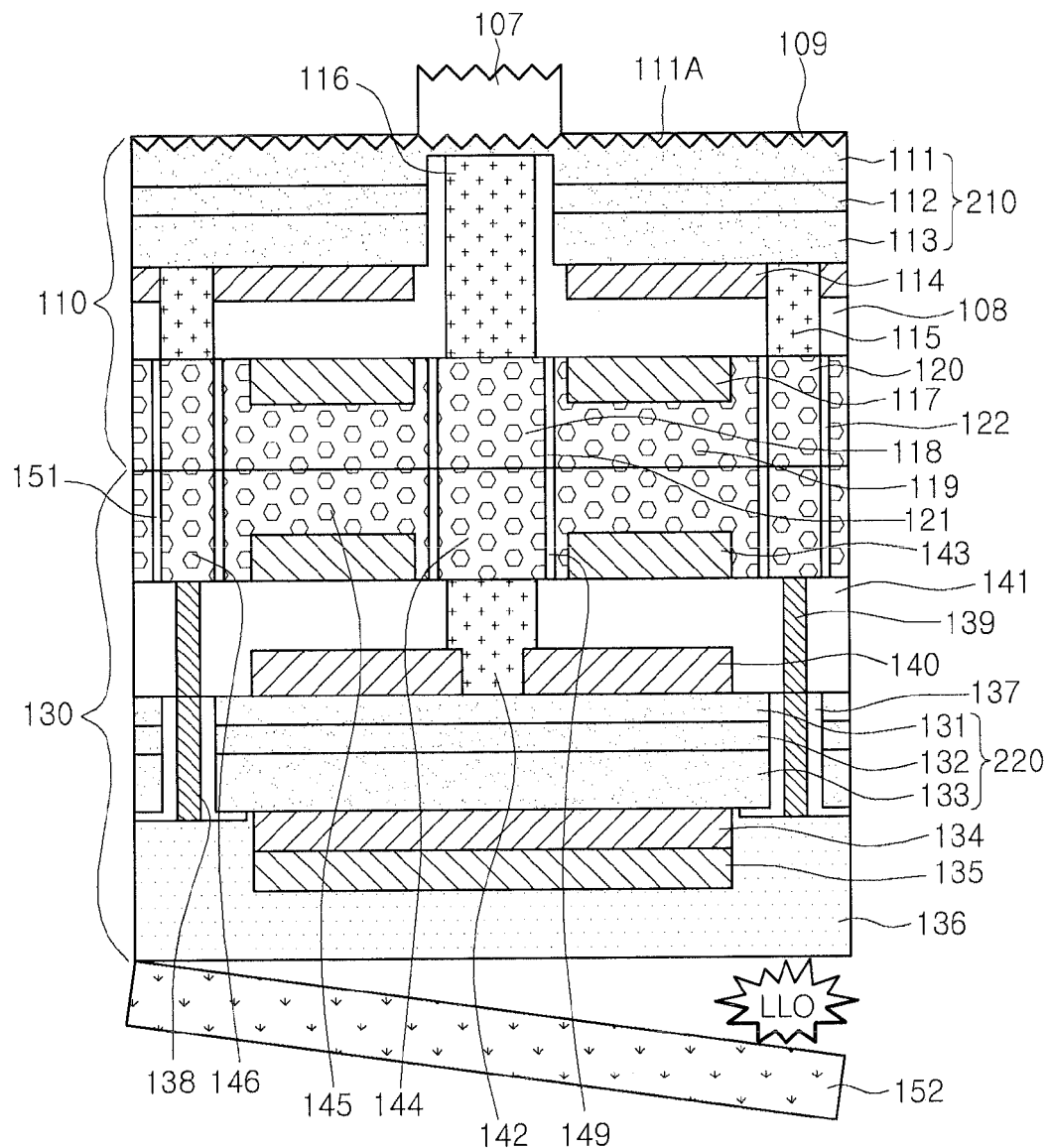
Figure 23:
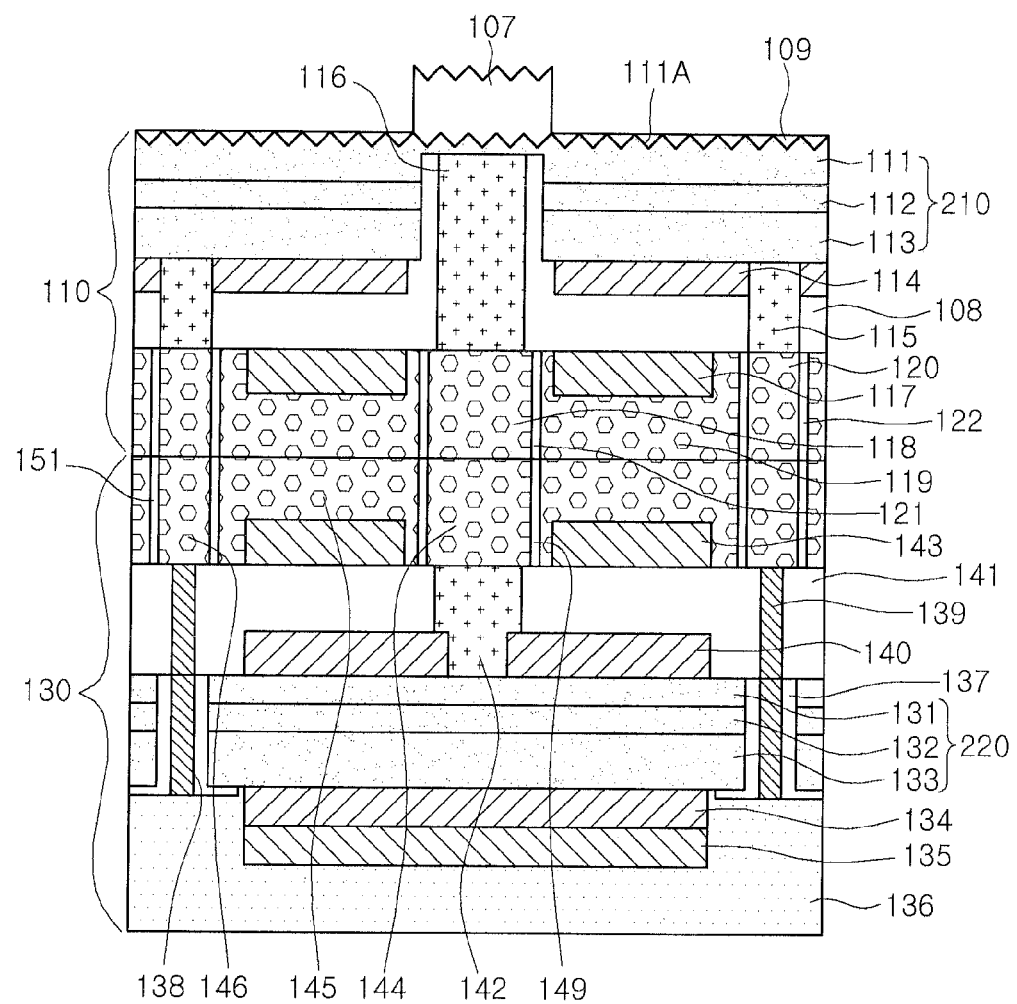

Referring to FIGS. 21 to 23, the elimination substrate 152 disposed at a base side of the second chip structure 130 may be removed by a debonding process. When the elimination substrate 152 is removed, the support member 136 is disposed on the base side of the second chip structure 130.

Since the first chip structure 110 is integrally bonded on the second chip structure 130, the light emitting device 100 having the plurality of chip structures 110 and 130 may be provided.

A power having first polarity is supplied to the first electrode 107 of the first chip structure 110. The power having the second polarity is supplied to the support member 136 of the second chip structure 130.

The power having the first polarity may be supplied to the first conductive type semiconductor layer 111 and the third conductive type semiconductor layer 131 of the second chip structure 130 through the second connection member 116, the second intermediate connection member 118, the fourth intermediate connection member 144, and the fourth connection member 142.

A power having the second polarity is supplied to the fourth conductive type semiconductor layer 133 through the support member 136. In addition, the power having the second polarity is supplied to the second conductive type semiconductor layer 113 via the first connection member 115 through the fifth connection member 138, the third connection member 139, the third intermediate connection member 146 of the second bonding layer 145, and the first intermediate connection member 120 of the first bonding layer 119. Thus, the active layers 112 and 132 of each of the structures 110 and 130 may emit light.

Since the first light emitting structure layer 210 and the second light emitting structure layer 220 are connected to each other in parallel, the first chip structure 110 and the second chip structure 130 may be operated in parallel to improve the light extraction efficiency. Also, due to the parallel structure, the other light emitting structure may be normally operated even though any one of the light emitting structure layers is defective in driving. In another embodiment, the first chip structure 110 may be connected to the second chip structure 130 in series. In this case, the first chip structure 110 and the second chip structure 130 may be connected to each other with an N-P-N-P or P-N-P-N junction structure.

The light emitting device 100 may emit laterally light through the second chip structure 130 and laterally and upwardly emit light through the first chip structure 110.

Also, the second chip structure 130 may emit colored light such as red, green, and blue light or UV light. The first chip structure 110 may emit colored light such as red, green, and blue light or UV light. Thus, the second chip structure 130 and the first chip structure 110 may emit light having the same color as each other or colors different from each other. For example, light having a plurality of colors may be emitted through one light emitting device 100, and white light may be realized by mixing light having the plurality of colors. Since the white light is emitted, a phosphor may not be separately added to a molding member sealing the light emitting device chip on the package.

According to the embodiment, a package including the light emitting device 100 of FIG. 1 may be manufactured, and the package may include a cavity or/and a lens. In the package, when all chip structures of the light emitting device of FIG. 1 emit blue light, at least kind of phosphor may be added. In this case, a light intensity may be one and half times or more than that of the other chip having the same size. Also, when the light emitting device of FIG. 1 emits light having a plurality of colors, target light (e.g., white light) may be realized through the plurality of colors on the package. A separate phosphor may not be added to the molding member, kinds of phosphor may be reduced.

According to the embodiment, the plurality of first chip structures 110 spaced from each other may be disposed on the second chip structure 130. The plurality of first chip structures 110 may be electrically connected (e.g., in parallel and/or in series) to the second chip structure 130 through the above-described connection members and emit light having the same color as each other or colors different from each other.

Figure 24:
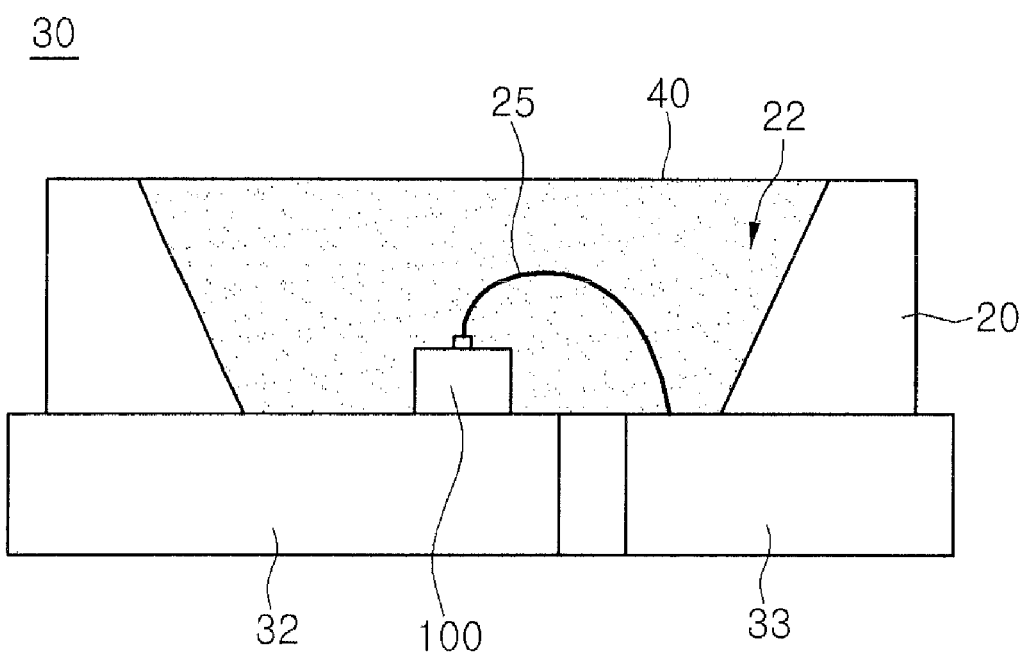
FIG. 24 is a view of a light emitting device package according to an embodiment.

FIG. 24 is a view of a light emitting device package according to an embodiment.

Referring to FIG. 24, a light emitting device package 30 includes a body 20, first and second lead electrodes 32 and 33 disposed on the body 20, a light emitting device 100 according to an embodiment, which is disposed on the body 31 and electrically connected to the first and second lead electrodes 32 and 33, and a molding member 40 surrounding the light emitting device 100.

The body 20 may include a conductive substrate formed of silicon, a synthetic resin material such as PPA, a ceramic substrate, an insulation substrate, or a metal substrate (e.g., MCPCB). An inclined surface may be disposed around the light emitting device 100. The body 20 may have a through hole structure, but is not limited thereto.

A cavity 22 having a predetermined depth may be defined in an upper portion of the body 20. The lead electrodes 32 and 33 and the light emitting device 100 are disposed in the cavity 22. A light emitting device according to another embodiment may be used as the light emitting device 100, but is not limited thereto.

The body 20 may have a flat top surface. In this case, the cavity 22 may not be provided.

The first and second lead electrodes 32 and 33 are electrically separated from each other and provide a power to the light emitting device 100. Also, the first and second lead electrodes 32 and 33 may reflect light emitted from the light emitting device 100 to improve light efficiency. In addition, the first and second lead electrodes 32 and 33 may discharge heat generated in the light emitting device 100 to the outside.

The light emitting device 100 may be disposed on the body 20 or the first or second lead electrodes 32 or 33. Each of the lead electrodes 32 and 33 may include at least one of a leadframe structure, a through hole structure, and a planting layer.

The light emitting device 100 includes the device according to the foregoing embodiment(s). The light emitting device 100 may be die-bonded on the first lead electrode 32 and bonded to the second lead electrode 33 using a wire 25.

The molding member 40 may be formed of a resin-based material such as silicon or epoxy. The molding member 40 may surround the light emitting device 100 to protect the light emitting device 100. Also, the molding member 40 may contain a phosphor to vary a wavelength of light emitted from the light emitting device 100. A lens may be disposed on the molding member 40. The lens may contact the molding member or may not contact the molding member.

The light emitting device 100 may emit blue light, and at least one kind of phosphor may be contained in the molding member 40. In this case, a light intensity may be one and half times or more than that of the other chip having the same size. Also, when the light emitting device 100 emits light having a plurality of colors, target light (e.g., white light) may be realized through the plurality of colors on the package. A separate phosphor may not be added to the molding member, kinds of phosphor may be reduced.

At least one light emitting device according to the foregoing embodiments may be mounted on the light emitting device package 30, but is not limited thereto.

The light emitting device 100 may include the plurality of chip structures as shown in FIG. 1. Also, the light emitting device 100 may be disposed on the body or the first or second lead electrodes 32 or 33.

<Lighting System>

The light emitting device or a light emitting device package according to an embodiment may be provided in plurality. The plurality of light emitting devices or the light emitting device packages may be arrayed on the substrate. Optical members such as a light guide plate, a prism sheet, and a diffusion sheet may be disposed on a path of the light emitted from the light emitting device. The light emitting device package, the substrate, and the optical members may serve as a lighting unit. The lighting unit may be manufactured in a top view type or a side view type. Thus, the lighting unit may be provided as display devices for a portable terminal, a notebook computer, etc, or variously applied to the lighting device, the indicating device, etc. Also, in another embodiment, the lighting unit may be realized as a lighting system including the light emitting device or the light emitting device package according to the above-described embodiments. For example, the lighting system may include illumination lamps, traffic lights, vehicle headlights, and signs.

The light emitting device according to the embodiment(s) may be packaged onto a semiconductor substrate formed of a resin material or silicon, an insulation substrate, or a ceramic substrate and used as light sources for an indicating device, a lighting device, and a display device. Also, each of the foregoing embodiments may not be limited to each of embodiments and applied to the foregoing other embodiments, but are not limited thereto.

The light emitting device package according to an embodiment may be applied to the lighting unit. The lighting unit includes a structure in which a plurality of light emitting devices or light emitting device packages is arrayed. For example, the lighting unit may include illumination lamps, traffic lights, vehicle headlights, and signs.

Figure 25:
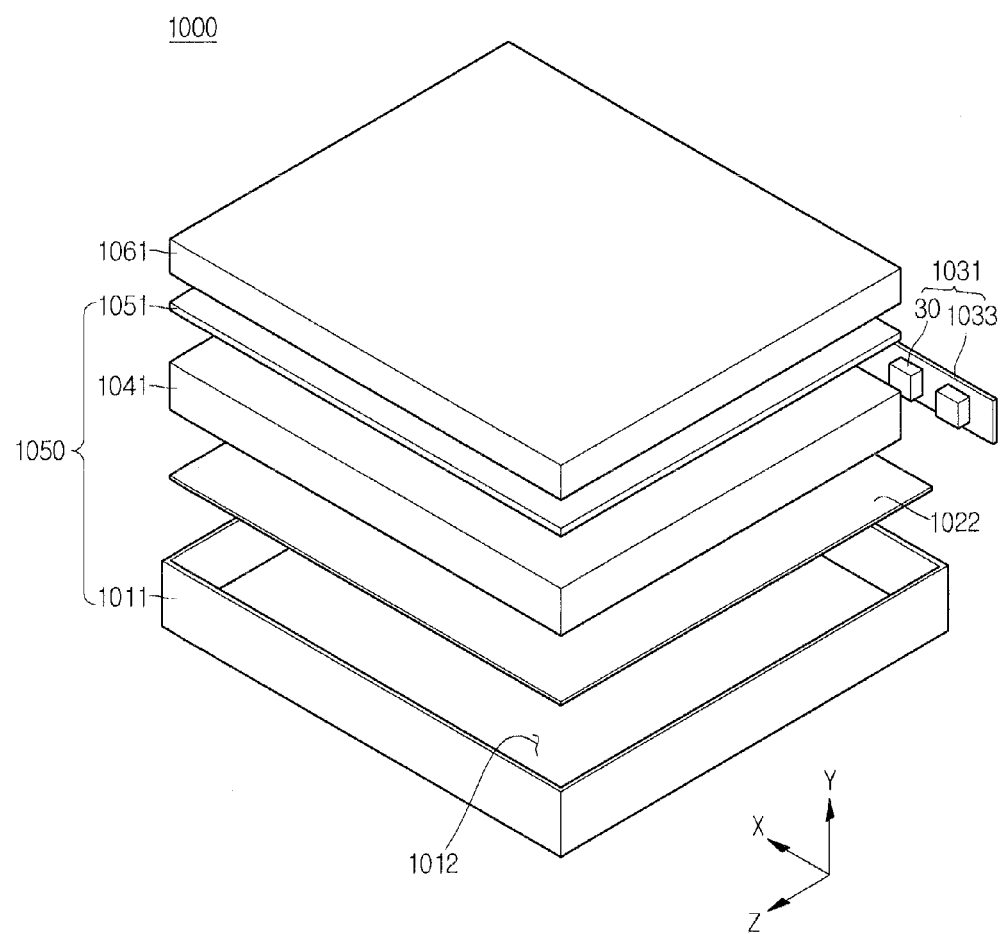
FIG. 25 is a diagram illustrating a display device according to an embodiment.
Figure 26:
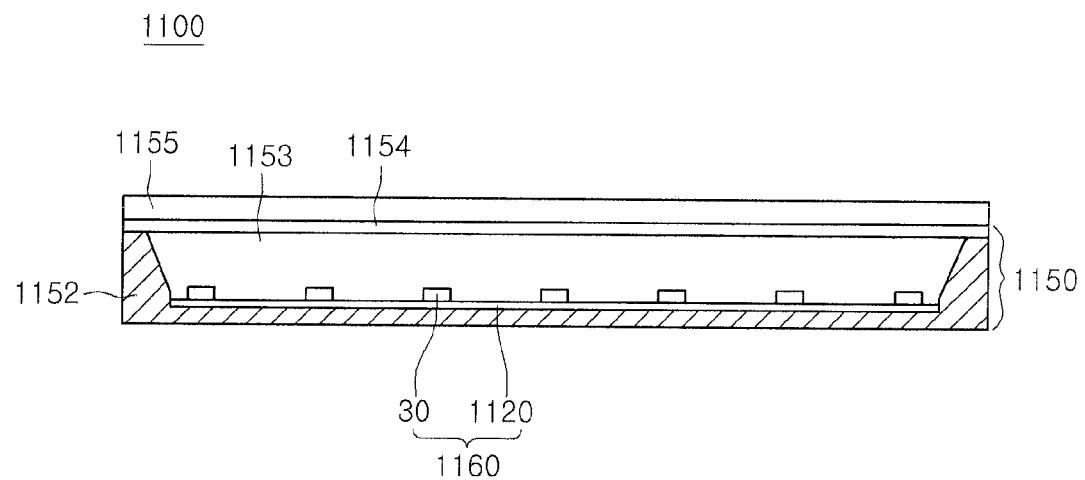
FIG. 26 is a diagram illustrating another display device according to an embodiment.
Figure 27:
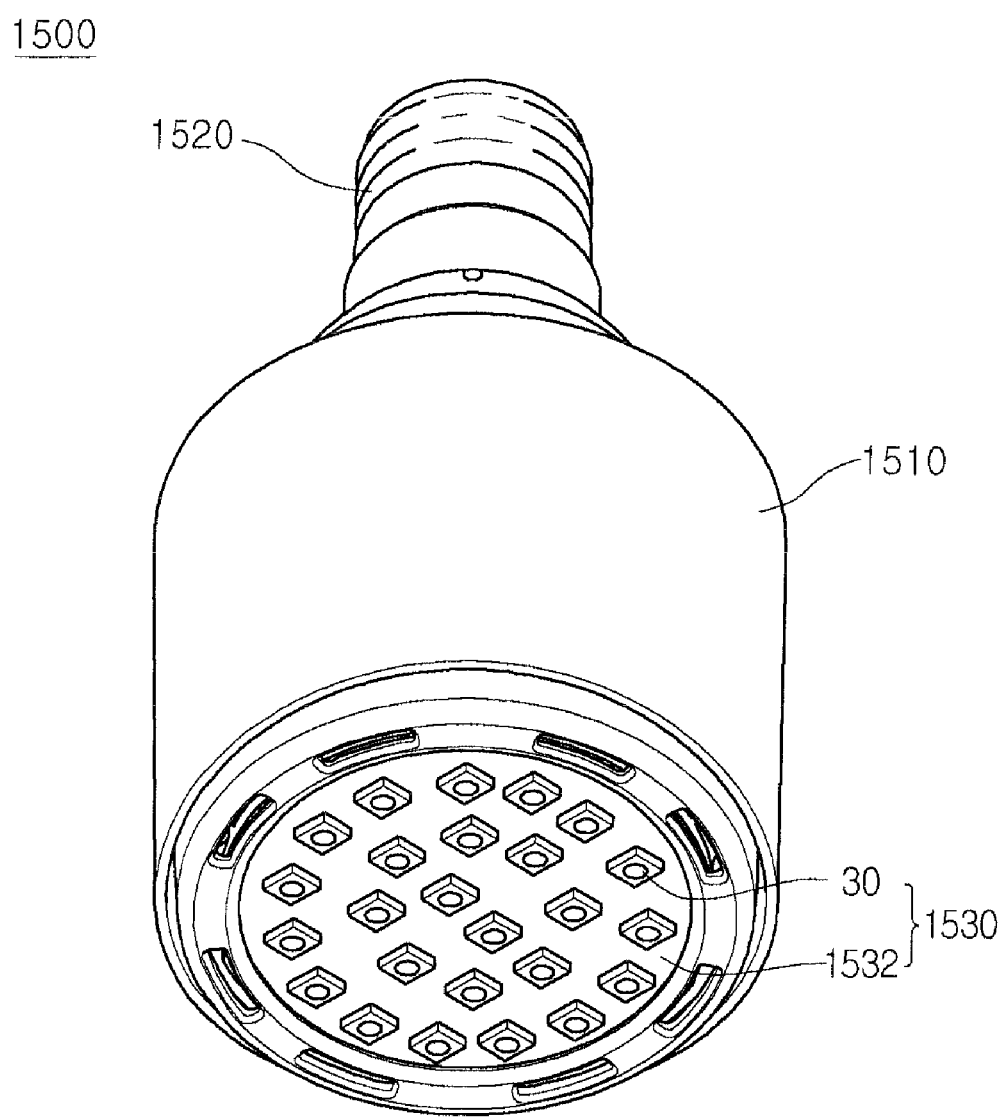
FIG. 27 is a diagram illustrating a lighting device according to an embodiment.

The illumination system may include display devices illustrated in FIGS. 25 and 26, an illumination device illustrated in FIG. 27, illumination lamps, signal lights, car headlights, electronic displays, and the like.

FIG. 25 is an exploded perspective view illustrating a display device according to an embodiment.

Referring to FIG. 25, a display device 1000 according to the embodiment may include a light guide plate 1041, a light emitting module 1031 providing light to the light guide plate 1041, a reflection member 1022 under the light guide plate 1041, an optical sheet 1051 on the light guide plate 1041, a display panel 1061 on the optical sheet 1051, and a bottom cover 1011 storing the light guide 1041, the light emitting module 1031, and the reflection member 1022; however, it is not limited to this.

The bottom cover 1011, the reflection sheet 1022, the light guide plate 1041, and the optical sheet 1051 may be defined as a light unit 1050.

The light guide plate 1041 serves to diffuse light for convergence to a surface light source. The light guide plate 1041 is formed with transparent material and, e.g., may include at least one selected from the group consisting of acrylic resin such as polymethyl metaacrylate (PMMA), polyethylene terephthlate (PET), poly carbonate (PC), cycloolefin copolymer (COC), and polyethylene naphthalate (PEN) resins.

The light emitting module 1031 provides light to at least one side of the light guide plate 1041 and ultimately acts as a light source of the display device.

At least one light emitting module 1031 is included, and it may provide light directly or indirectly at one side of the light guide plate 1041. The light emitting module 1031 includes a substrate 1033 and the light emitting device package according to the above-disclosed embodiment. The light emitting device package 30 may be arrayed at predetermined intervals on the substrate 1033.

The substrate 1033 may be a Printed Circuit Board (PCB) including a circuit pattern (not illustrated). However, the substrate 1033 may include not only the typical PCB but also a metal core PCB (MCPCB) and a flexible PCB (FPCB), and it is not limited to this. In the case that the light emitting device package 30 is installed on the side of the bottom cover 1011 or on a heat radiating plate, the substrate 1033 may be eliminated. Herein, a part of the heat radiating plate may be contacted to an upper surface of the bottom cover 1011.

The plurality of light emitting device packages 30 may be installed on the substrate 1033 so that a light-emitting surface is separated from the light guide plate 1041 by a predetermined distance, and there is no limit for this. The light emitting device package 30 may provide light to a light-entering part, i.e., one side, of the light guide plate 1041 directly or indirectly, and there is no limit for this.

The reflection member 1022 may be disposed under the light guide plate 1041. The reflection member 1022 reflects the light incident to the lower surface of the light guide plate 1041 in an upward direction so that brightness of the light unit 1050 may be improved. The reflection member 1022 may be formed with, e.g., PET, PC, PVC (polyvinyl chloride) resins; however, it is not limited to this. The reflection member 1022 may be the upper surface of the bottom cover 1011; however, there is no limit for this.

The bottom cover 1011 may store the light guide plate 1041, the light emitting module 1031, and the reflection member 1022. To this end, the bottom cover 1011 may be provided with a storing unit 1012 having a shape of a box whose upper surface is open, and there is not limit for this. The bottom cover 1011 may be combined with a top cover, and there is no limit for this.

The bottom cover 1011 may be formed with metal material or resin material and may be fabricated using processes of press or extrusion molding. The bottom cover 1011 may also include metal or non-metal material having good thermal conductivity, and there is no limit for this.

The display panel 1061 is, e.g., an LCD panel, and includes transparent first and second substrates, and a liquid crystal layer between the first and second substrates. On at least one side of the display panel 1061, a polarizing plate may be attached; however, the attaching structure is not limited to this. The display panel 1061 displays information by the light which passes through the optical sheet 1051. The display device 1000 may be applied to various cell phones, monitors of notebook computers, monitors of laptop computers, and televisions.

The optical sheet 1051 is disposed between the display panel 1061 and the light guide plate 1041 and includes at least one translucent sheet. The optical sheet 1051 may include at least one of, e.g., diffusion sheet, horizontal and vertical prism sheets, and brightness enhancement sheet. The diffusion sheet diffuses the incident light. The horizontal or/and vertical prism sheet concentrates the incident light to a display region. The brightness enhancement sheet reuses lost light to enhance brightness. A protection sheet may be disposed on the display panel 1061, and there is no limit for this.

Herein, on the light path of the light emitting module 1031, the light guide plate 1041 and the optical sheet 1051 may be included as optical members; however, there is no limit for this.

FIG. 26 is a diagram illustrating a display device according to an embodiment.

Referring to FIG. 26, a display device 1100 includes a bottom cover 1152, a substrate 1120, an optical member 1154, and a display panel 1155. Herein, the above-disclosed light emitting device packages 30 are arrayed on the substrate 1120.

The substrate 1120 and the light emitting device package 30 may be defined as a light emitting module 1060. The bottom cover 1152, at least one light emitting module 1060, and the optical member 1154 may be defined as a light unit.

The bottom cover 1152 may be provided with a storing unit 1153, and there is no limit for this.

Herein, the optical member 1154 may includes at least one of the lens, light guide plate, diffusion sheet, horizontal and vertical prism sheets, and brightness enhancement sheet. The light guide plate may be formed with PC material or polymethyl metaacrylate (PMMA) material, and this light guide plate may be eliminated. The diffusion sheet diffuses the incident light. The horizontal or/and vertical prism sheet concentrates the incident light to the display region. The brightness enhancement sheet reuses lost light to enhance brightness.

The optical member 1154 is disposed on the light emitting module 1060. The optical member 1154 converts the light emitted from the light emitting module 1060 to the surface light source, or performs diffusing and concentrating light.

FIG. 27 is a perspective view illustrating a lighting device according to an embodiment.

Referring to FIG. 27, an illumination device 1500 may include a case 1510, a light emitting module 1530 installed to the case 1510, and a connection terminal 1520 installed to the case 1510 and provided with power from an external power source.

It is preferable to form the case 1510 with material which has good heat radiation characteristics. For instance, the case 1510 may be formed with metal material or resin material.

The light emitting module 1530 may include a substrate 1532 and the light emitting device package 30 according to the embodiment installed on the substrate 1532. The plurality of light emitting device packages 30 may be arrayed in a matrix form or may be arrayed being separated from each other at predetermined intervals.

The substrate 1532 may be an insulator where a circuit pattern is printed. For instance, the substrate 1532 may include the PCB, metal core PCB, flexible PCB, ceramic PCB, and FR-4 substrate.

The substrate 1532 may also be formed with material which efficiently reflects light, or its surface may be coated with color, e.g., white and silver, which efficiently reflects light.

At least one light emitting device package 30 may be installed on the substrate 1532. Each of the light emitting device packages 30 may include at least one Light Emitting Diode (LED) chip. The LED chip may include a light emitting diode of visible light such as red, green, blue, or white or a UV light emitting diode which emits Ultra Violet (UV).

A combination of various light emitting device packages 30 may be disposed in the light emitting module 1530 for obtaining color tone and brightness. For instance, for securing high Color Rendering Index (CRI), a white light emitting diode, a red light emitting diode, and a green light emitting diode may be combined and disposed.

The connection terminal 1520 may be electrically connected to the light emitting module 1530 to supply power. The connection terminal 1520 is screwed to be connected to the external power source in a socket method; however, there is no limit for this. For instance, the connection terminal 1520 may be formed as a pin shape to be inserted into the external power source or may be connected to the external power source by a wire.

A method of manufacturing a light emitting device according to an embodiment includes: forming a first light emitting structure layer including a first conductive type semiconductor layer, a first active layer, and a second conductive type semiconductor layer; forming a first chip structure including forming a first bonding layer on the first light emitting structure layer; forming a second chip structure including forming a second light emitting structure layer including a third conductive type semiconductor layer, a second active layer, and a fourth conductive type semiconductor layer, forming a support member on the second light emitting structure, and forming a second bonding layer under the first light emitting structure layer; bonding the first bonding layer of the first chip structure on the second bonding layer of the second chip structure; and forming a first electrode on the first conductive type semiconductor layer of the first light emitting structure.

The embodiments may improve the light extraction efficiency. Also, the embodiments may improve chip yield by vertically jointing the plurality of LED chips. Also, the embodiments may improve the light extraction efficiency by disposing the electrode layer on at least side of each of the chip structures. Also, the embodiments may improve light emitting efficiency by parallely connecting the plurality of chip structures to each other. Also, according to the embodiments, since the plurality of chip structures are connected to each other in parallel, the other chip structure may be normally operated even though one chip structure is defective.

Also, the plurality of chip structures may be connected to each other to effectively operate the chip structures.

Any reference in this specification to "one embodiment," an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first light emitting structure layer comprising a first conductive type semiconductor layer, a second conductive type semiconductor layer, and a first active layer between the first conductive type semiconductor layer and the second conductive type semiconductor layer;
a first electrode coupled to the first conductive type semiconductor layer;
a first reflective layer under the first light emitting structure layer;
a second light emitting structure layer comprising a third conductive type semiconductor layer, a fourth conductive type semiconductor layer, and a second active layer between the third conductive type semiconductor layer and the fourth conductive type semiconductor layer;
a second reflective layer under the second light emitting structure layer;
a bonding layer between the second light emitting structure layer and the first reflective layer;
a first connector to connect the first conductive type semiconductor layer of the first light emitting structure layer to the third conductive type semiconductor layer of the second light emitting structure layer;
a second connector to connect the second conductive type semiconductor layer of the first light emitting structure layer to the fourth conductive type semiconductor layer of the second light emitting structure layer;
a first insulation layer between the first light emitting structure and the bonding layer;
a second insulation layer between the second light emitting structure layer and the bonding layer, wherein the second connector passes through the first insulation layer, the bonding layer, the second insulation layer, and the second light emitting structure layer to connect electrically the second conductive type semiconductor layer to the second reflective layer, and the first connector passes through a portion of the first light emitting structure layer, the first insulation layer, the bonding layer, and the second insulation layer to connect electrically the first conductive type semiconductor layer to the third conductive type semiconductor layer.

2. The light emitting device of claim 1, wherein each of the first conductive type semiconductor layer and the third conductive type semiconductor layer comprises an N-type semiconductor layer, and the second conductive type semiconductor layer and the fourth conductive type semiconductor layer comprises a P-type semiconductor layer.

3. The light emitting device of claim 1, further comprising an insulation material for prevent the first and second connectors from contacting the other layer is disposed around the first and second connectors.

4. The light emitting device of claim 1, further comprising
at least one of a first conductive layer disposed between the second conductive type semiconductor layer and the first insulation layer and coupled to the second connector;
a second conductive layer disposed between the third conductive type semiconductor layer and the second insulation layer and coupled to the first connector; and
a third conductive layer between the fourth conductive type semiconductor layer and the second reflective layer.

5. The light emitting device of claim 4, wherein the first to third conductive layers comprise a transmissive material.

6. The light emitting device of claim 1, wherein the bonding layer comprises:
a first bonding layer under the first insulation layer; and
a second bonding layer disposed between the second insulation layer and the first bonding layer and jointed to the first bonding layer.

7. The light emitting device of claim 1, wherein at least one of the first connector or the second connector includes a plurality of connector portions.

8. The light emitting device of claim 1, further comprising a conductive support under the second reflective layer,
wherein the conductive support is electrically connected to the second connector and the second reflective layer.

9. The light emitting device of claim 1, further comprising a third reflective layer between the bonding layer and the second insulation layer.

10. A light emitting device comprising:
a first light emitting structure layer comprising a first conductive type semiconductor layer, a first active layer, and a second conductive type semiconductor layer;
a first electrode on the first light emitting structure layer;
a first insulation layer under the first light emitting structure layer;
a second light emitting structure layer comprising a third conductive type semiconductor layer, a second active layer, and a fourth conductive type semiconductor layer;
a conductive support under the second light emitting structure layer;
a plurality of bonding layers disposed between the first insulation layer and the second light emitting structure layer and jointed to each other;
a second insulation layer between the bonding layer and the second light emitting structure layer;
at least one connector to connect at least one layer of the first light emitting structure layer to at least one layer of the second light emitting structure layer;
a first reflective layer on a top surface of the bonding layer; and
a second reflective layer under a lower surface of the bonding layer, wherein at least portions of the first reflective layer and the second reflective layer are embedded in the bonding layer.

11. The light emitting device of claim 10, wherein the at least one connector comprises:

a first connector to connect the first conductive type semiconductor layer of the first light emitting structure layer to the third conductive type semiconductor layer of the second light emitting structure; and
a second connector to connect the second conductive type semiconductor layer of the first light emitting structure to the fourth conductive type semiconductor layer of the second light emitting structure.

12. The light emitting device of claim 10, further comprising
a light extractor coupled to at least one surface of the first light emitting structure layer and the second light emitting structure layer.

13. The light emitting device of claim 10, further comprising a third reflective layer between the second light emitting structure layer and the conductive support.

14. The light emitting device of claim 10, further comprising
a transmissive conductive layer on a surface of at least one layer of at least one of the first light emitting structure layer or the second light emitting structure layer.

15. The light emitting device of claim 10, wherein the first light emitting structure layer emits light having at least one selected from the group consisting of green, blue, red, yellow, and ultraviolet wavelength bands, and the second light emitting structure layer emits light having at least one selected from the group consisting of green, blue, red, yellow, and ultraviolet wavelength bands.

16. A light emitting device package comprising:
a body;
a plurality of lead electrodes on the body;
a light emitting device bonded on at least one lead electrode of the plurality of lead electrodes, the light emitting device being electrically connected to the plurality of lead electrodes; and
a molding material to mold the light emitting device,
wherein the light emitting device comprises:
a first light emitting structure layer comprising a first conductive type semiconductor layer, a second conductive type semiconductor layer, and a first active layer between the first conductive type semiconductor layer and the second conductive type semiconductor layer;
a first electrode coupled to the first conductive type semiconductor layer; a first reflective layer under the first light emitting structure layer;
a second light emitting structure layer comprising a third conductive type semiconductor layer, a fourth conductive type semiconductor layer, and a second active layer between the third conductive type semiconductor layer and the fourth conductive type semiconductor layer;
a second reflective layer under the second light emitting structure layer;
a bonding layer between the second light emitting structure layer and the first reflective layer;
a first connector to connect the first conductive type semiconductor layer of the first light emitting structure layer to the third conductive type semiconductor layer of the second light emitting structure layer;
a second connector to connect the second conductive type semiconductor layer of the first light emitting structure layer to the fourth conductive type semiconductor layer of the second light emitting structure layer;
a first insulation layer between the first light emitting structure and the bonding layer;
a second insulation layer between the second light emitting structure layer and the bonding layer, wherein the second connector passes through the first insulation layer, the bonding layer, the second insulation layer, and the second light emitting structure layer to connect electrically the second conductive type semiconductor layer to the second reflective layer, and the first connector passes through a portion of the first light emitting structure layer, the first insulation layer, the bonding layer, and the second insulation layer to connect electrically the first conductive type semiconductor layer to the third conductive type semiconductor layer.

* * * * *